(12) United States Patent
Kwon et al.

(10) Patent No.: US 9,842,893 B2
(45) Date of Patent: Dec. 12, 2017

(54) ORGANIC LIGHT EMITTING DISPLAY APPARATUS

(71) Applicant: Samsung Display Co., Ltd., Yongin-si, Gyeonggi-do (KR)

(72) Inventors: Sun-Ja Kwon, Yongin-si (KR); Ji-Eun Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/882,859

(22) Filed: Oct. 14, 2015

(65) Prior Publication Data

US 2016/0240601 A1 Aug. 18, 2016

(30) Foreign Application Priority Data

Feb. 12, 2015 (KR) ........................ 10-2015-0021439

(51) Int. Cl.
*H01L 27/32* (2006.01)
*H01L 27/12* (2006.01)

(52) U.S. Cl.
CPC ...... *H01L 27/3276* (2013.01); *H01L 27/3262* (2013.01); *H01L 27/3265* (2013.01); *H01L 27/124* (2013.01); *H01L 27/1248* (2013.01); *H01L 27/1255* (2013.01)

(58) Field of Classification Search
None
See application file for complete search history.

(56) References Cited

U.S. PATENT DOCUMENTS

| 8,519,396 | B2* | 8/2013 | Lee | ...................... H01L 27/1255 257/52 |
| 9,007,541 | B2* | 4/2015 | Chen | ...................... G02F 1/1362 349/38 |
| 2006/0267885 | A1* | 11/2006 | Kwak | .................. G09G 3/3233 345/76 |
| 2012/0105388 | A1* | 5/2012 | Han | ....................... G09G 3/325 345/204 |
| 2013/0256706 | A1* | 10/2013 | Chen | ...................... G02F 1/1362 257/88 |
| 2014/0034923 | A1* | 2/2014 | Kim | ..................... H01L 27/3297 257/40 |
| 2014/0098078 | A1* | 4/2014 | Jeon | ...................... G09G 3/3208 345/205 |

FOREIGN PATENT DOCUMENTS

| KR | 10-2006-0074728 | 7/2006 |
| KR | 10-2007-0041219 | 4/2007 |
| KR | 10-2012-0118419 | 10/2012 |
| KR | 10-2014-0070105 | 6/2014 |

* cited by examiner

*Primary Examiner* — Joseph Schoenholtz
(74) *Attorney, Agent, or Firm* — Knobbe Martens Olson & Bear, LLP

(57) ABSTRACT

An organic light emitting display apparatus includes a base substrate, an active pattern disposed on the base substrate, a data line disposed on the base substrate, and a driving voltage line disposed on the base substrate. The active pattern includes a first transistor including a source area, a drain area and a channel. The active pattern also includes a first capacitor area and a second capacitor area. The data line extends in a first direction. The data line is overlapped with the first capacitor area. The driving voltage line extends in a second direction substantially perpendicular to the first direction. The driving voltage line is overlapped with the second capacitor area.

19 Claims, 20 Drawing Sheets

ORGANIC LIGHT EMITTING DISPLAY APPARATUS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to Korean Patent Application No. 10-2015-0021439, filed on Feb. 12, 2015, the disclosure of which is incorporated by reference herein in its entirety.

BACKGROUND

Field

Embodiments relate to an organic light emitting display apparatus.

Description of the Related Technology

A display device displays an image using a pixel emitting the light. An organic light emitting display device includes the pixel having an organic light emitting diode (OLED). The OLED emits the light of which wavelength depends on an organic material included in the OLED. For example, the OLED includes organic materials corresponding to one of a red color light, a green color light, and a blue color light. The organic light emitting display device displays the image by mixing the light emitted by the organic materials.

The pixel includes a plurality of transistors and capacitors to drive the organic light emitting display apparatus. The transistors basically include a switching transistor and a driving transistor. A signal for driving the transistors may be influenced by a fluctuation of signal near the transistors. Accordingly, there has been a problem about image quality degradation.

SUMMARY OF CERTAIN INVENTIVE ASPECTS

Embodiments provide an organic light emitting display apparatus capable of improving image quality.

According to some example embodiments, an organic light emitting display apparatus includes a base substrate, an active pattern disposed on the base substrate, a data line disposed on the base substrate, and a driving voltage line disposed on the base substrate. The active pattern includes a first transistor including a source area, a drain area and a channel. The active pattern also includes a first capacitor area and a second capacitor area. The data line extends in a first direction. The data line is overlapped with the first capacitor area. The driving voltage line extends in a second direction substantially perpendicular to the first direction. The driving voltage line is overlapped with the second capacitor area.

In example embodiments, the organic light emitting display apparatus may further include a first insulation layer disposed between the first capacitor area and the data line and between the second capacitor area and the driving voltage line.

In example embodiments, the organic light emitting display apparatus may further include a first gate electrode overlapping the channel of the first transistor. The first insulation layer may be disposed between the gate electrode and the channel of the first transistor.

In example embodiments, the organic light emitting display apparatus may further include a second insulation layer disposed between the first capacitor area and the data line and between the second capacitor area and the driving voltage line.

In example embodiments, a portion of the driving voltage line may be configured to overlap the first gate electrode. The second insulation layer may be disposed between the portion of the driving voltage line.

In example embodiments, the driving voltage line and the data line may include a same conductive layer.

In example embodiments, the organic light emitting display apparatus may further include a first gate electrode overlapping the channel of the first transistor, a scan line disposed on the base substrate and extending in a first direction, a data initialization line disposed on the base substrate and substantially parallel with the scan line, an initialization voltage line disposed on the base substrate and substantially parallel with the scan line, an emission control line disposed on the base substrate and substantially parallel with the scan line, and a bypass control line disposed on the base substrate and substantially parallel with the scan line.

In example embodiments, the organic light emitting display apparatus may further include an auxiliary driving voltage line disposed on the base substrate and substantially parallel with the scan line. The auxiliary driving voltage line may be electrically connected to the driving voltage line.

In example embodiments, the first gate electrode, the scan line, the data initialization line, the initialization voltage line, the emission control line, the bypass control line and the auxiliary driving voltage line may be formed on a same layer.

In example embodiments, the organic light emitting display apparatus may further include a first connecting portion electrically connecting the initialization voltage line to the active pattern, a second connecting portion electrically connecting the first gate electrode to the active pattern, and a third connecting portion electrically connecting the active pattern to a first electrode for driving a organic light emitting diode.

In example embodiments, the first capacitor area and the second capacitor area may be electrically connected to the source area of the first transistor.

In example embodiments, the active pattern may further include a second source area, a second drain area and a second channel of a second transistor. The active pattern may further include a third source area, a third drain area and a third channel of a third transistor. The active pattern may further include a fourth source area, a fourth drain area and a fourth channel of a fourth transistor. The active pattern may further include a fifth source area, a fifth drain area and a fifth channel of a fifth transistor. The first capacitor area and the second capacitor area of the active pattern may be electrically connected to the second transistor and the fifth transistor.

In example embodiments, the first capacitor area and second capacitor area may be directly connected to the first source area, the second drain area and the fifth drain area.

In example embodiments, the active pattern may further include a sixth source area, a sixth drain area and a sixth channel of a sixth transistor. The active pattern may further include a seventh source area, a seventh drain area and a seventh channel of a seventh transistor.

In example embodiments, the organic light emitting display apparatus may further include a data driving part configured to alternately output a first data signal and a second data signal to pixels different from each other in one horizontal period.

According to some example embodiments, an organic light emitting display apparatus includes a plurality of pixels. Each of the pixels includes an organic light emitting diode, a first transistor, a second transistor, a storage capacitor, a first capacitor and a second capacitor. The first transistor is configured to operate the organic light emitting diode by generating a driving voltage. The first transistor includes a first data signal electrode, a first connection electrode and a first gate electrode. The second transistor includes a second data signal electrode to which a data signal is applied, a second connection electrode which is electrically connected to the first data signal electrode and a gate electrode to which a scan signal is applied. The storage capacitor is formed between a first power voltage and the first gate electrode. The first capacitor is formed between the data signal and the first data signal electrode. The second capacitor is formed between the first power voltage and the first data signal electrode.

In example embodiments, the organic light emitting display apparatus may further include a data driving part configured to alternately output a first data signal and a second data signal to pixels different from each other in one horizontal period.

In example embodiments, the organic light emitting display apparatus may further include a third transistor comprising a third gate electrode to which the scan signal is applied, a third gate signal electrode which is electrically connected to a the second first connection electrode, and a third connection electrode which is electrically connected to the first gate electrode; and a fourth transistor comprising a fourth gate electrode to which a data initialization signal is applied, a fourth data signal electrode to which an initialization voltage is applied, and a fourth connection electrode which is electrically connected to the first gate electrode.

In example embodiments, the organic light emitting display apparatus may further include a fifth transistor comprising a fifth gate electrode to which an emission signal is applied, a fifth data signal electrode to which the first power voltage is applied, a fifth connection electrode which is electrically connected to the first data signal electrode; a sixth transistor comprising a sixth gate electrode to which the emission signal is applied, a sixth data signal electrode which is electrically connected to the first connection electrode, and a sixth connection electrode which is electrically connected to a first electrode of the organic light emitting diode; and a seventh transistor comprising a seventh gate electrode to which a diode initialization signal is applied, a seventh data signal electrode to which the initialization voltage is applied, and a seventh connection electrode which is electrically connected to the first electrode of the organic light emitting diode.

In example embodiments, the first capacitor and the second capacitor may be formed by a parasitic capacitance.

Therefore, embodiments of an organic light emitting display apparatus may have a simplified structure and have improved image quality.

BRIEF DESCRIPTION OF THE DRAWINGS

The above and other features will become more apparent by describing certain embodiments with reference to the accompanying drawings, in which.

DETAILED DESCRIPTION OF CERTAIN INVENTIVE EMBODIMENTS

Hereinafter, certain embodiments will be described in detail with reference to the accompanying drawings.

Figure 1:
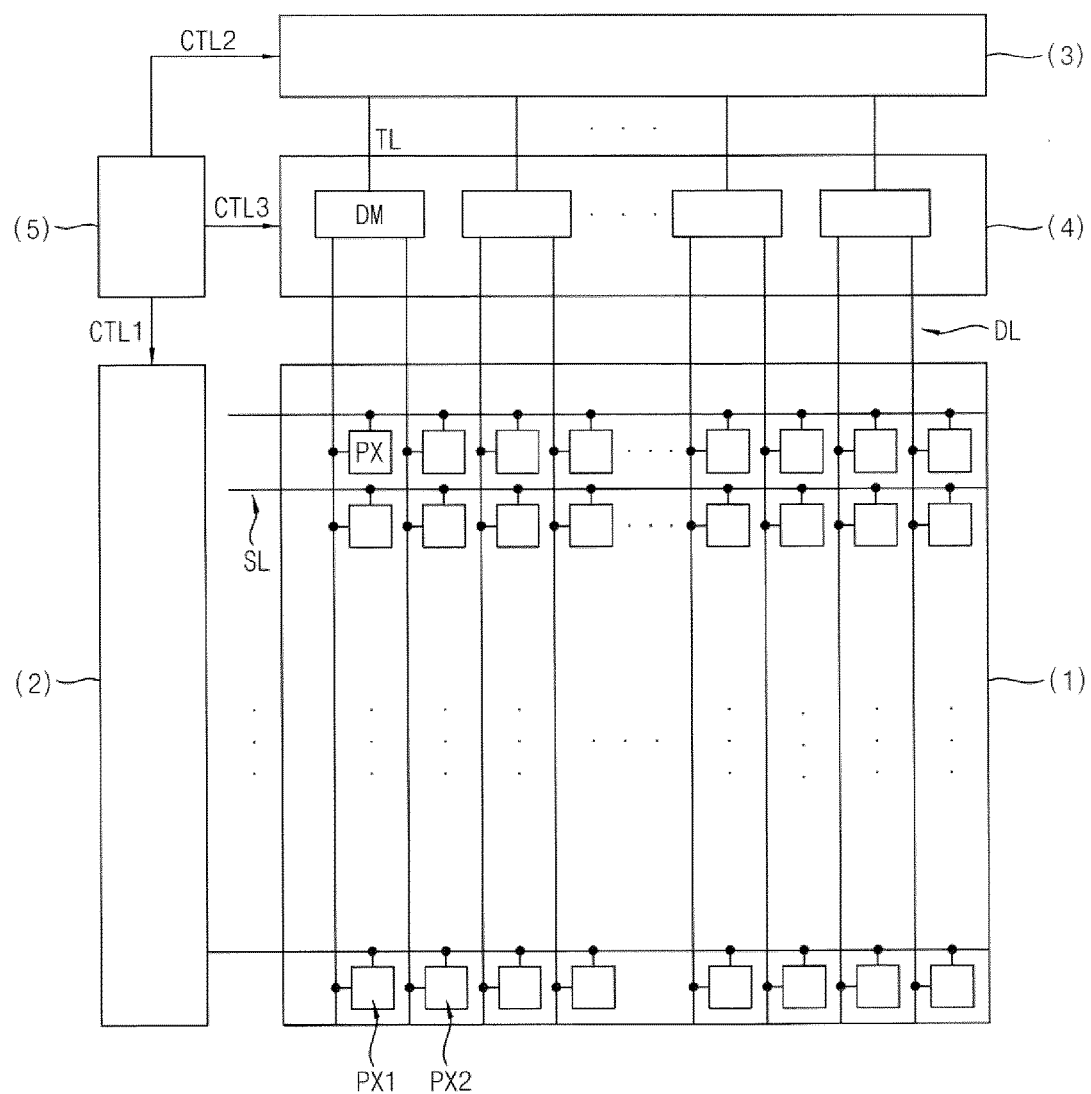
FIG. 1 is a block diagram illustrating an organic light emitting display apparatus according to an example embodiment.

FIG. 1 is a block diagram illustrating an organic light emitting display apparatus according to an example embodiment.

Referring to FIG. 1, the organic light emitting display apparatus may include a display panel 1, a scan driver 2, a data driver 3, a demultiplexer 4, and a timing controller 5.

The display panel 1 may include first pixels PX1 and second pixels PX2. The first and second pixels may be arranged at locations corresponding to crossing points of scan-lines SL and data-lines DL. Each of the first and second pixels PX1 and PX2 may be coupled to one of the scan-lines SL and one of the data-lines DL, and thus may receive a scan signal (refer to GW of FIG. 2) transmitted via the scan-lines SL and a data signal (refer to DATA of FIG. 2) transmitted via the data-lines DL.

The scan driver 2 may sequentially output the scan signal to the display panel 1. For example, when the scan signal is output to a first scan-line SL, the first and second data signals may be applied to the first and second pixels PX1 and PX2 coupled to the first scan-line SL, respectively. Similarly, when the scan signal is output to a second scan-line SL, the first and second data signals may be applied to the first and second pixels PX1 and PX2 coupled to the second scan-line SL, respectively. Thus, when the scan driver 2 outputs the scan signal to a specific scan-line SL, the first pixels PX1 coupled to the specific scan-line SL may receive the first data signal, the second pixels PX2 coupled to the specific scan-line SL may receive the second data signal.

The data driver 3 may alternately output the first data signal for the first pixels PX1 and the second data signal for the second pixels PX2 to the display panel 1. The first data signal for the first pixels PX1 and the second data signal for the second pixels PX2 may be sequentially output during one horizontal period.

As illustrated in FIG. 1, the organic light emitting display device may have a demultiplexing structure. Thus, the demultiplexer 4 may be placed between the display panel 1 and the data driver 3, where the demultiplexer 4 includes a plurality of demultiplexers DM. The demultiplexer 4 may alternately receive the first data signal and the second data signal from the data driver 3, and may alternately apply the first data signal and the second data signal to the first pixels PX1 and the second pixels PX2. For example, as the data driver 3 alternately outputs the first data signal and the second data signal via an output-line TL (or as the data driver 3 sequentially outputs the first data signal and the second data signal via the first output-line TL during one horizontal period), the demultiplexer DM coupled to the output-line TL may alternately apply the first data signal and the second data signal to the first pixels PX1 and the second pixels PX2.

Thus, the demultiplexer 4 may apply the first data signal to the first pixels PX1 while the data driver 3 simultaneously outputs the first data signal, and may apply the second signal to the second pixels PX2 while the data driver 3 simultaneously outputs the second data signal.

The timing controller 5 may control the scan driver 120, the data driver 130, and the demultiplexer 140. As illustrated in FIG. 1, the timing controller 5 may generate a first control signal CTL1, a second control signal CTL2, and a third control signal CTL3, and may control the scan driver 2, the data driver 3 and the demultiplexer 4 by providing the first control signal CTL1, the second control signal CTL2, and the third control signal CTL3 to the scan driver 2, the data driver 3, and the demultiplexer 4, respectively. Specifically, the timing controller 5 may provide the first control signal CTL1 to the scan driver 2. Thus, the scan driver 2 may sequentially output the scan signal to the display panel 1. In addition, the timing controller 5 may provide the second control signal CTL2 to the data driver 3. Thus, the data driver 3 may alternately output the first data signal for the first pixels PX1 and the second data signal for the second pixels PX2 to the display panel 1. Further, the timing controller 5 may provide the third control signal CTL3 to the demultiplexer 4. Thus, the demultiplexer 4 may alternately apply the first data signal and the second data signal to the first pixels PX1 and the second pixels PX2.

Figure 2:
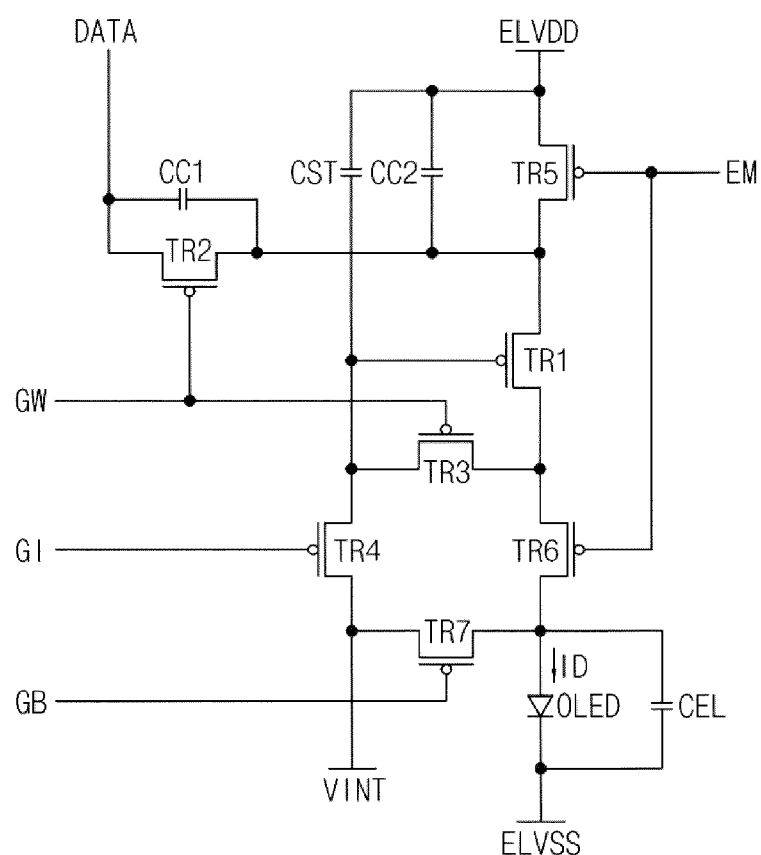
FIG. 2 is an equivalent circuit diagram illustrating a pixel of the organic light emitting display apparatus of FIG. 1.

FIG. 2 is an equivalent circuit diagram illustrating a pixel of the organic light emitting display apparatus of FIG. 1.

Referring to FIG. 2, the pixel may include an OLED (organic light emitting diode), a first transistor TR1, a second transistor TR2, a third transistor TR3, a storage capacitor CST, a fourth transistor TR4, a fifth transistor TR5, a sixth transistor TR6, and a seventh transistor TR7. In one example embodiment, the pixel may further include a first capacitor CC1, a second capacitor CC2 and a diode parallel capacitor CEL. The first capacitor CC1, the second capacitor CC2 and the diode parallel capacitor CEL may be parasitic capacitors in some embodiments.

The OLED may emit the light based on a driving current ID. The OLED may include a first electrode and a second electrode. In one example embodiment, a second power voltage ELVSS may be applied to the second electrode of the OLED. In one example embodiment, the first electrode of the OLED may be an anode electrode, and the second electrode of the OLED may be a cathode electrode. In another example embodiment, the first electrode of the OLED may be the cathode electrode, and the second electrode of the OLED may be the anode electrode.

The first transistor TR1 may include a gate electrode, a first electrode, and a second electrode. In one example embodiment, the first electrode of the first transistor TR1 may be a source electrode, and the second electrode of the first transistor TR1 may be a drain electrode. In another example embodiment, the first electrode of the first transistor TR1 may be a drain electrode, and the second electrode of the first transistor TR1 may be a source electrode.

The first transistor TR1 may generate the driving current ID. In one example embodiment, the first transistor TR1 may operate in a saturation region. In this case, the first transistor TR1 may generate the driving current ID based on a voltage difference between the gate electrode and the source electrode of the first transistor TR1. The grayscale may be presented based on the driving current ID provided to the OLED. In another example embodiment, the first transistor TR1 may operate in a linear region. In this case, the grayscale may be presented based on a time length in which the driving current ID is provided to the OLED.

The second transistor TR2 may include a gate electrode, a first electrode and a second electrode. A scan signal GW may be applied to the gate electrode. A data signal DATA may be applied to the first electrode. The second electrode may be connected to the first electrode of the first transistor TR1. In one example embodiment, the first electrode of the second transistor TR2 may be a source electrode, and the second electrode of the second transistor TR2 may be a drain electrode. In another example embodiment, the first electrode of the second transistor TR2 may be a drain electrode, and the second electrode of the second transistor TR2 may be a source electrode.

The second transistor TR2 may provide the data signal DATA to the first electrode of the first transistor TR1 while the scan signal GW is activated. The second transistor TR2 may operate in the linear region.

The third transistor TR3 may include a gate electrode, a first electrode and a second electrode. The scan signal GW may be applied to the gate electrode. The first electrode may be connected to the second electrode of the first transistor TR1. The second electrode may be connected to the gate electrode of the first transistor TR1. In one example embodiment, the first electrode of the third transistor TR3 may be a source electrode, and the second electrode of the third transistor TR3 may be a drain electrode. In another example embodiment, the first electrode of the third transistor TR3 may be a drain electrode, and the second electrode of the third transistor TR3 may be a source electrode.

The third transistor TR3 may connect the gate electrode of the first transistor TR1 to the second electrode of the first transistor TR1 while the scan signal GW is activated. The third transistor TR3 may operate in a linear region. Thus, the third transistor TR3 may form a diode connection of the first transistor TR1 while the scan signal GW is activated. The voltage difference between the first electrode of the first transistor TR1 and the gate electrode of the first transistor TR1, the voltage difference of which amount corresponds to a threshold voltage of the first transistor TR1, may be occurred by the diode connection. In result, a sum voltage of the data signal DATA provided to the first electrode of the first transistor TR1 and the voltage difference (or the threshold voltage) may be applied to the gate electrode of the first transistor TR1 while the scan signal GW is activated. Thus, the data signal DATA may be compensated as much as the threshold voltage of the first transistor TR1. The compensated data signal DATA may be applied to the gate electrode of the first transistor TR1. A uniformity of the driving current ID may be improved because of reducing an affect by the threshold voltage of the first transistor TR1.

The storage capacitor CST may include a first electrode to which a first power voltage ELVDD is applied, and a second electrode connected to the gate electrode of the first transistor TR1. The storage capacitor CST may maintain a voltage level of the gate electrode of the first transistor TR1 while the scan signal GW is inactivated. An emission signal EM may be activated while the scan signal GW is inactivated. The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

The fourth transistor TR4 may include a gate electrode, a first electrode and a second electrode. A data initialization signal GI may be applied to the gate electrode. An initialization voltage VINT may be applied to the first electrode. The second electrode may be connected to the gate electrode of the first transistor TR1. In one example embodiment, the first electrode of the fourth transistor TR4 may be a source electrode, and the second electrode of the fourth transistor TR4 may be a drain electrode. In another example embodiment, the first electrode of the fourth transistor TR4 may be a drain electrode, and the second electrode of the fourth transistor TR4 may be a source electrode.

The fourth transistor TR4 may apply the initialization voltage VINT to the gate electrode of the first transistor TR1 while the data initialization signal GI is activated. The fourth transistor TR4 may operate in the linear region. Thus, the fourth transistor TR4 may initialize the gate electrode of the first transistor TR1 as the initialization voltage VINT while the data initialization signal GI is activated. In one example embodiment, a voltage level of the initialization voltage VINT may be lower than a voltage level of the data signal DATA maintained by the storage capacitor CST in previous frame. The initialization voltage VINT may be applied to the gate electrode of the first transistor TR1 that is a p-channel metal oxide semiconductor (PMOS)-type transistor. In another example embodiment, a voltage level of the initialization voltage VINT may be higher than the voltage level of the data signal DATA maintained by the storage capacitor CST in previous frame. The initialization voltage VINT may be applied to the gate electrode of the first transistor TR1 that is an n-channel metal oxide semiconductor (NMOS)-type transistor.

In one example embodiment, the data initialization signal GI may be identical to the scan signal GW advanced by one horizontal time period. For example, the data initialization signal GI is applied to pixels located in the (n)th row, and the data initialization signal GI may be substantially the same to the scan signal GW applied to pixels located in the (n−1)th row. Thus, the data initialization signal GI that is activated may be applied to pixels located in the (n)th row by applying the scan signal GW that is activated to pixels located in the (n−1)th row. As a result, the gate electrode of the first transistor TR1 included in pixels located in the (n)th row may be initialized as the initialization voltage VINT when the data signal DATA is applied pixels located in the (n−1)th row.

The fifth transistor TR5 may include a gate electrode, a first electrode and a second electrode. The emission signal EM may be applied to the gate electrode. The first power voltage ELVDD may be applied the first electrode. The second electrode may be connected to the first electrode of the first transistor TR1. In one example embodiment, the first electrode of the fifth transistor TR5 may be a source electrode, and the second electrode of fifth transistor TR5 may be a drain electrode. In another example embodiment, the first electrode of the fifth transistor TR5 may be a drain electrode, and the second electrode of the fifth transistor TR5 may be a source electrode.

The fifth transistor TR5 may apply the first power voltage ELVDD to the first electrode of the first transistor TR1 while the emission signal EM is activated. The fifth transistor TR5 may not apply the first power voltage ELVDD while the emission signal EM is inactivated. The fifth transistor TR5 may operate in the linear region. The fifth transistor TR5 may apply the first power voltage ELVDD to the first electrode of the first transistor TR1 while the emission signal EM is activated such that the first transistor TR1 generates the driving current ID. In addition, the fifth transistor TR5 may not apply the first power voltage ELVDD while the emission signal EM is inactivated such that the data signal DATA applied to the first electrode of the first transistor TR1 is applied to the gate electrode of the first transistor TR1.

The sixth transistor TR6 may include a gate electrode, a first electrode and a second electrode. The emission signal EM may be applied to the gate electrode. The first electrode may be connected to the second electrode of the first transistor TR1. The second electrode may be connected to the first electrode of the OLED. In one example embodiment, the first electrode of the sixth transistor TR6 may be a source electrode, and the second electrode of sixth transistor TR6 may be a drain electrode. In another example embodiment, the first electrode of the sixth transistor TR6 may be a drain electrode, and the second electrode of the sixth transistor TR6 may be a source electrode.

The sixth transistor TR6 may provide the driving current ID generated by the first transistor TR1 to the OLED while the emission signal EM is activated. The sixth transistor TR6 may operate in the linear region. Thus, the sixth transistor TR6 may provide the driving current ID generated by the first transistor TR1 to the OLED while the emission signal EM is activated such that the OLED emits the light. In addition, the sixth transistor TR6 may disconnect the first transistor TR1 from the OLED while the emission signal EM is inactivated such that the compensated data signal DATA applied to the second electrode of the first transistor TR1 is applied to the gate electrode of the first transistor TR1.

The seventh transistor TR7 may include a gate electrode, a first electrode and a second electrode. A diode initialization signal GB may be applied to the gate electrode. The initialization voltage VINT may be applied to the first electrode. The second electrode may be connected to the first electrode of the OLED. In one example embodiment, the first electrode of the seventh transistor TR7 may be a source electrode, and the second electrode of seventh transistor TR7 may be a drain electrode. In another example embodiment, the first electrode of the seventh transistor TR7 may be a drain electrode, and the second electrode of the seventh transistor TR7 may be a source electrode.

The seventh transistor TR7 may apply the initialization voltage VINT to the first electrode of the OLED while the diode initialization signal GB is activated. The seventh transistor TR7 may operate in the linear region. Thus, the seventh transistor TR7 may initialize the first electrode of the OLED as the initialization voltage VINT while the diode initialization signal GB is activated. An initial changing amount of the diode parallel capacitor CEL may be calculated according to [Equation 1] below:

$$Qi = CEL \times (VINT - ELVSS) \quad \text{Equation 1}$$

wherein, Qi is the initial changing amount of the diode parallel capacitor, CEL is a capacitance of the diode parallel capacitor, VINT is a voltage level of the initialization voltage, and ELVDD is a voltage level of the second power voltage.

In one example embodiment, the data initialization signal GI and the diode initialization signal GB may be the same signal. An initialization operation of the gate electrode of the first transistor TR1 may not affect an initialization operation of the first electrode of the OLED. Therefore, the data initialization signal GI is used as the diode initialization signal GB, thereby improving the manufacturing efficiency.

A voltage difference between both electrodes of the OLED may be lower than a threshold voltage of the OLED when the OLED does not emit the light. The OLED may emit the light when the voltage difference is higher than the threshold voltage. Therefore, the voltage difference may reach the threshold voltage and the light may be emitted when a threshold capacitance is charged in the diode parallel capacitor CEL. The threshold capacitance may be calculated according to [Equation 2] below:

$$Qc = CEL \times Vth \qquad \text{Equation 2}$$

wherein, Qc is the threshold capacitance, CEL is the capacitance of the diode parallel capacitor, Vth is the threshold voltage of the OLED.

In one example embodiment, the driving current ID is not zero by a leakage current generated from the first transistor TR1 when the OLED presents a black color light (or the grayscale is zero). However the leakage current may flow through the diode parallel capacitor CEL instead of the OLED until the voltage difference between both electrodes of the OLED reach to the threshold voltage. The OLED may not emit the light while the diode parallel capacitor CEL is charged by the leakage current until the threshold capacitance. For example, if the leakage current has fixed amount, the initialization voltage VINT may be calculated according to [Equation 3] below:

$$VINT \leq ELVSS + Vth - \frac{I_{leak} \times t}{CEL} \qquad \text{Equation 3}$$

wherein, VINT is a voltage level of the initialization voltage, ELVSS is a voltage level of the second power voltage, Vth is the threshold voltage of the OLED, Ileak is an amount of the leakage current, t is a time length not to emit the light in one frame, and CEL is a capacitance of the diode parallel capacitor.

The first capacitor CC1 may be formed between the data signal DATA and the first electrode of the first transistor TR1.

The first capacitor CC1 may prevent displaying quality degradation according to fluctuation of the data signal DATA.

The organic light emitting display apparatus having a demultiplexing structure (refer to 100 of FIG. 1) may alternately apply the data signal DATA to pixels adjacent to each other during one horizontal period, displaying quality may be degraded due to the fluctuation of the data signal DATA. However, the pixel includes the first capacitor CC1 and the second capacitor CC2, so that influences by the fluctuation of the data signal DATA may be reduced. Thus, displaying quality may be improved.

The second capacitor CC2 may be formed between the first power voltage ELVDD and the first electrode of the first transistor TR1.

The voltage level of the first electrode of the first transistor may be influenced by fluctuation of voltage of other electrodes near the first electrode of the first transistor during a driving of the pixel, so that display quality may be degraded. However, the second capacitor CC2 may reduce amount of changes of voltage level of the first electrode due to the fluctuation of voltage of other electrodes near the first electrode. Thus, displaying quality may be improved.

Figure 3:
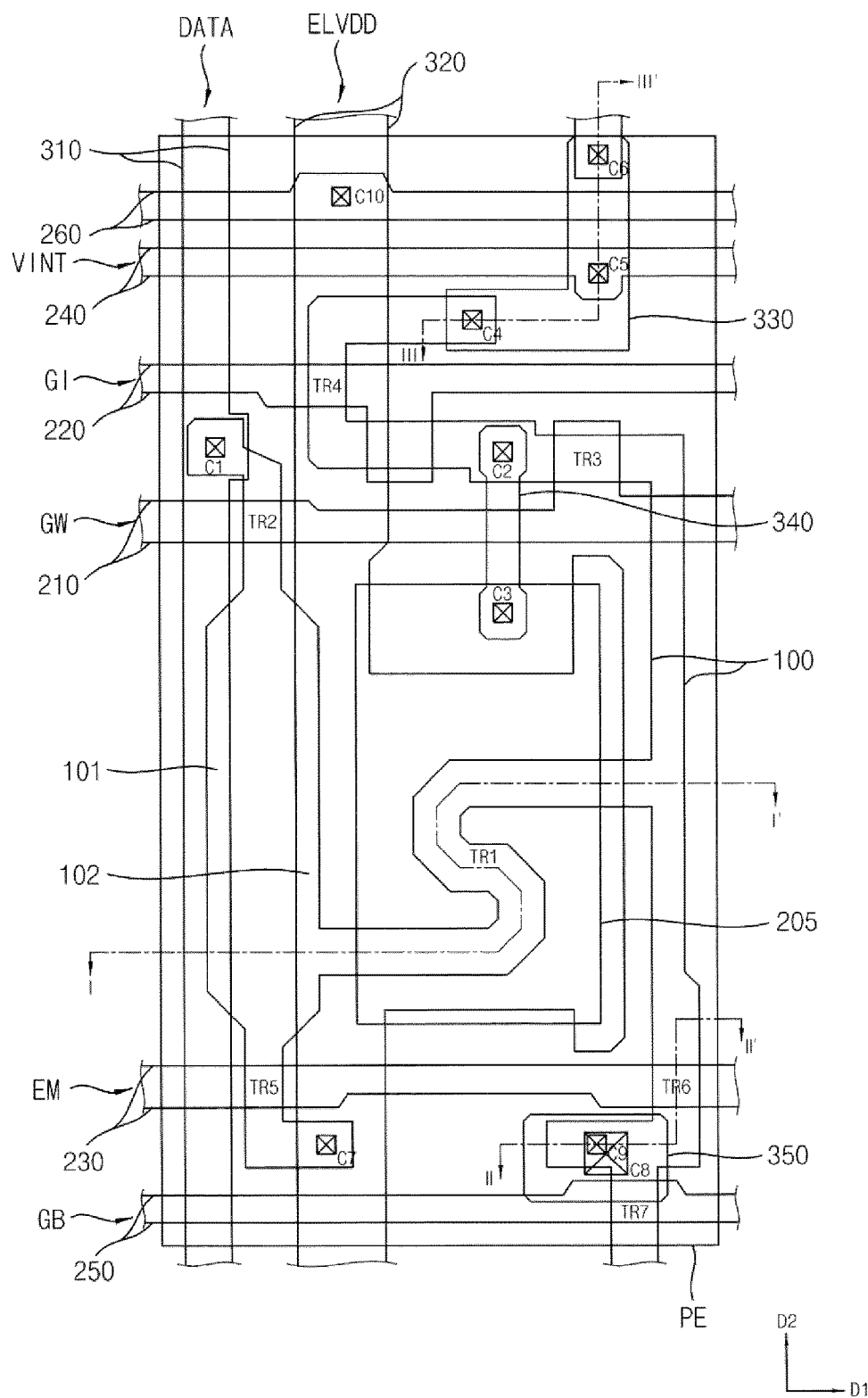
FIG. 3 is a plan view illustrating a pixel of an organic light emitting display apparatus according to an example embodiment.
Figure 4A:
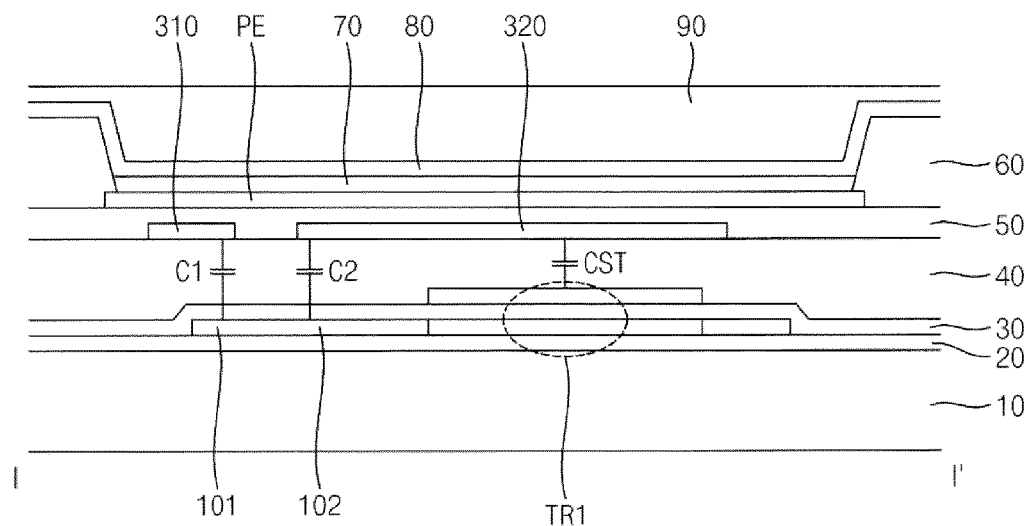
FIG. 4A is a cross-sectional view taken along a line I-I' of FIG. 3.
Figure 4B:
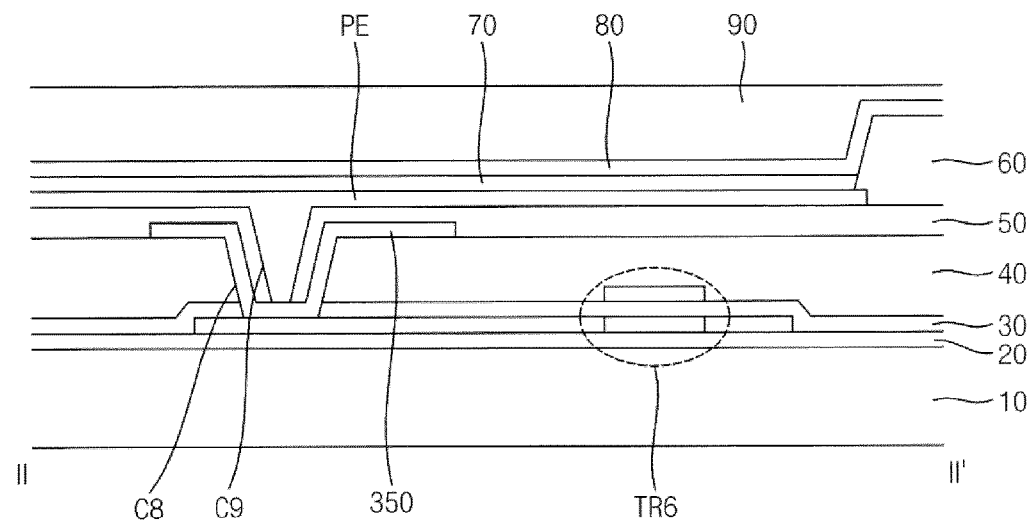
FIG. 4B is a cross-sectional view taken along a line II-II' of FIG. 3.
Figure 4C:
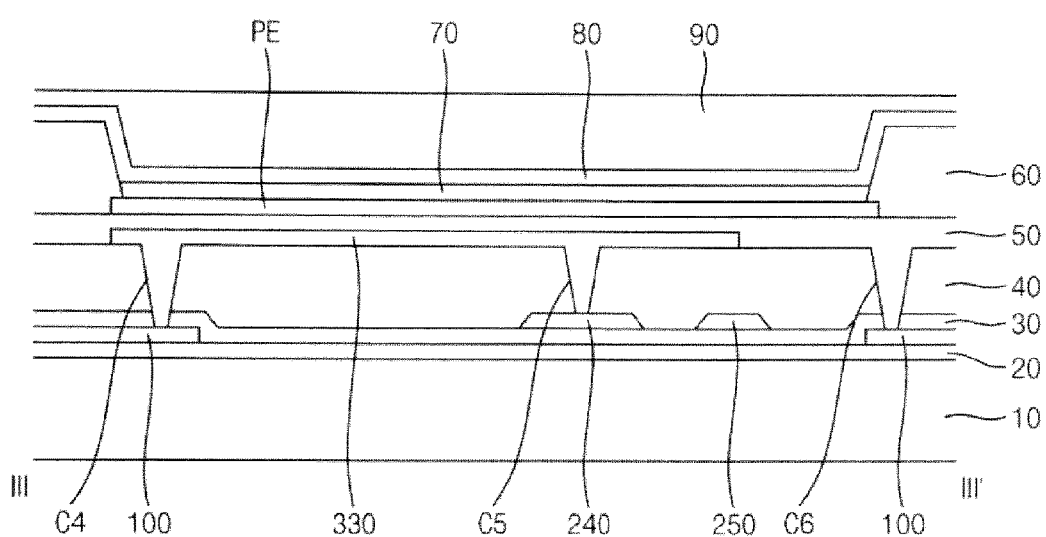
FIG. 4C is a cross-sectional view taken along a line III-III' of FIG. 3.

FIG. 3 is a plan view illustrating a pixel of an organic light emitting display apparatus according to an example embodiment. FIG. 4A is a cross-sectional view taken along a line I-I' of FIG. 3. FIG. 4B is a cross-sectional view taken along a line II-II' of FIG. 3. FIG. 4C is a cross-sectional view taken along a line III-III' of FIG. 3.

Referring to FIGS. 3 and 4C, the organic light emitting display apparatus may include a base substrate 10, a buffer layer 20, an active pattern 100, a first insulation layer 30, a gate pattern, a second insulation layer 40, a data pattern, a third insulation layer 50, a first electrode PE, a pixel defining layer 60, a light emitting structure 70, a second electrode 80 and a protecting layer 90.

The base substrate 10 may include a transparent insulation substrate. For example, the base substrate 10 may include a glass substrate, a quartz substrate, a transparent resin substrate, or the like. Examples of the transparent resin substrate for the base substrate 10 may include polyimide-based resin, acryl-based resin, polyacrylate-based resin, polycarbonate-based resin, polyether-based resin, sulfonic acid containing resin, polyethyleneterephthalate-based resin, and the like.

The buffer layer 20 may be disposed on the base substrate 10. The buffer layer 20 may prevent diffusion of metal atoms and/or impurities from the base substrate 10. Additionally, the buffer layer 20 may adjust heat transfer rate of a successive crystallization process for an active pattern 100, thereby obtaining a substantially uniform active pattern 100. In case that the base substrate 10 may have a relatively irregular surface, the buffer layer 20 may improve flatness of the surface of the base substrate 10. The buffer layer 20 may include a silicon compound. For example, the buffer layer 20 may include silicon oxide (SiOx), silicon nitride (SiNx), silicon oxynitride (SiOxNy), silicon oxycarbide (SiOxCy), silicon carbon nitride (SiCxNy), or the like. These may be used alone or in a mixture. The buffer layer 20 may have a single layer structure or a multi layer structure. For example, the buffer layer 20 may have a single-layered structure including a silicon oxide film, a silicon nitride film, a silicon oxynitride film, a silicon oxycarbide film or a silicon carbon nitride film. Alternatively, the buffer layer 20 may have a multilayered structure including at least two of a silicon oxide film, a silicon nitride film, a silicon oxynitride film, a silicon oxycarbide film, a silicon carbon nitride film, and the like.

The active pattern 100 may be disposed on the buffer layer 20. In one example embodiment, the active pattern 100 may include silicon (Si). In another example embodiment, the active pattern 100 may include a semiconductor oxide containing a binary compound (ABx), a ternary compound (ABxCy) and/or a quaternary compound (ABxCyDz). For example, the active pattern 100 may include indium (In), zinc (Zn), gallium (Ga), stannum (Sn), titanium (Ti), aluminum (Al), hafnium (Hf), zirconium (Zr) and/or magnesium (Mg).

The active pattern 100 may include a channel, a first electrode and a second electrode of a first transistor TR1, a channel, a first electrode and a second electrode of a second transistor TR2, a channel, a first electrode and a second electrode of a third transistor TR3, a channel, a first electrode and a second electrode of a fourth transistor TR4, a channel, a first electrode and a second electrode of a fifth transistor TR5, a channel, a first electrode and a second electrode of a sixth transistor TR6, and a channel, a first electrode and a second electrode of a seventh transistor TR7.

The first insulation layer 30 may be disposed on the buffer layer 20 configured to cover the active pattern 100. The first insulation layer 30 may include a silicon compound, metal oxide, and the like. For example, the first insulation layer 30 may include silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), or the like. These may be used alone or in a combination thereof. In addition, the first insulation layer 30 may have a single layer structure or a multi layer structure including the silicon oxide and/or the silicon nitride. In example embodiments, the first insulation layer 30 may be uniformly formed on the buffer layer 20 along a profile of the active pattern 100. The first insulation layer 30 may have a substantially small thickness, such that a stepped portion may be formed at a portion of the first insulation layer 30 adjacent to the active pattern 100. In some example embodiments, the first insulation layer 30 may have a relatively large thickness for sufficiently covering the active pattern 100, so that the first insulation layer 30 may have a substantially level surface.

The gate pattern may be disposed on the first insulation layer 30. For example, the gate pattern may be positioned on a portion of the first insulation layer 30 under which the active pattern 100 is located. The gate pattern may include metal, alloy, conductive metal oxide, a transparent conductive material, or the like. For example, the gate pattern may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), or the like. These may be used alone or in a combination thereof. In example embodiments, the gate pattern may have a single layer structure or a multi layer structure, which may include a metal film, an alloy film, a metal nitride film, a conductive metal oxide film and/or a transparent conductive film.

The gate pattern may include a first gate electrode 205, a scan line 210, a data initialization line 220, an emission control line 230, an initialization voltage line 240, a bypass control line 250 and an auxiliary driving voltage line 260.

The first gate electrode 205 may include a gate electrode (refer to E1 of FIG. 9A) of the first transistor TR1, where the gate electrode of the first transistor TR1 overlaps the channel of the first transistor TR1.

The scan line 210 may extend in a first direction D1. A scan signal GW may be applied to the scan line 210. The scan line 210 may be electrically connected to a gate electrode of the second transistor TR2. For example, the gate electrode of the second transistor TR2 may be a portion of the scan line 210. The scan line 210 may be electrically connected to the gate electrode of the third transistor TR3. For example, the gate electrode of the third transistor TR3 may be a portion of the scan line 210.

The data initialization line 220 may extend in the first direction D1, so that the data initialization line 220 is disposed in parallel with the scan line 210. A data initialization signal GI is applied to the data initialization line 220. The data initialization signal GI may be identical to a scan signal of a previous horizontal time period. The data initialization line 220 may be electrically connected to a gate electrode of the fourth transistor TR4. For example, the gate electrode of the fourth transistor TR4 may be a portion of the data initialization line 220.

The emission control line 230 may extend in the first direction D1, so that the emission control line 230 is disposed in parallel with the scan line 210. An emission signal EM may be applied to the emission control line 230. The emission control line 230 may be electrically connected to a gate electrode of the fifth transistor TR5. For example, the gate electrode of the fifth transistor TR5 may be a portion of the emission control line 230. The emission control line 230 may be electrically connected to a gate electrode of the sixth transistor TR6. For example, the gate electrode of the sixth transistor TR6 may be a portion of the emission control line 230.

The initialization voltage line 240 may extend in the first direction D1, so that the initialization voltage line 240 is disposed in parallel with the scan line 210. An initialization voltage VINT may be applied to the initialization voltage line 240.

The bypass control line 250 may extend in the first direction D1, so that the bypass control line 250 is disposed in parallel with the scan line 210. A diode initialization signal GB may be applied to the bypass control line 250. The bypass control line 250 may be electrically connected to a gate electrode of the seventh transistor TR7. For example, the gate electrode of the seventh transistor TR7 may be a portion of the bypass control line 250.

The auxiliary driving voltage line 260 may extend in the first direction D1, so that the auxiliary driving voltage line 260 is disposed in parallel with the scan line 210.

The second insulation layer 40 may be disposed on the first insulation layer 30 on which the gate pattern is disposed. The second insulation layer 40 having a substantially uniform thickness may be conformally formed on the first insulation layer 30 along a profile of the gate pattern. Thus, a stepped portion may be generated at a portion of the second insulation layer 40 adjacent to the gate pattern. The second insulation layer 40 may include a silicon compound. For example, the second insulation layer 40 may include silicon oxide, silicon nitride, silicon oxynitride, silicon oxycarbide and/or silicon carbon nitride. These may be used alone or in a mixture thereof.

First to eight and tenth contact holes C1 to C8 and C10 may be formed through the first and second insulation layer 30 and 40, or through the second insulation layer 40.

The data pattern may be formed on the second insulation layer 40. For example, the data pattern may include metal, alloy, conductive metal oxide, a transparent conductive material, and the like. For example, the data pattern may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), and the like. These may be used alone or in a combination thereof. In example embodiments, the data pattern may have a single layer structure or a multi layer structure, which may include a metal film, an alloy film, a metal nitride film, a conductive metal oxide film and/or a transparent conductive film.

The data pattern may include a data line 310, a driving voltage line 320, a first connecting portion 330, a second connecting portion 340 and a third connecting portion 350.

The data line 310 may extend in a second direction D2 substantially perpendicular to the first direction D1. A data signal DATA may be applied to the data line 310. The data line 310 may be electrically connected to the active pattern 100 through the first contact hole C1. Thus, the data line 310 is electrically connected to the first electrode of the second transistor TR2 through the first contact hole C1.

The driving voltage line 320 may extend in the second direction D2, so that driving voltage line 320 is disposed in parallel with the data line 310. A first power voltage ELVDD may be applied to the driving voltage line 320.

A portion of the driving voltage line 320 may overlap the first gate electrode 205 configured to form a storage capacitor CST. The driving voltage line 320 may be electrically connected to the auxiliary driving voltage line 260 through the tenth contact hole C10. The driving voltage line 320 may be electrically connected to the active pattern 100 through the seventh contact hole C7. Thus, the driving voltage line 320 may by electrically connected to the first electrode of the fifth transistor TR5 through the seventh contact hole C7.

The first connecting portion 330 may be electrically connected to the active pattern 100 through the fourth contact hole C4. The first connecting portion 330 may be electrically connected to the initialization voltage line 240 through the fifth contact hole C5. The first connecting portion 330 may be electrically connected to the active pattern 100 through the sixth contact hole C6. Thus, the first connecting portion 330 may be electrically connected to a first electrode of a seventh transistor TR7 of an adjacent pixel.

The second connecting portion 340 may be electrically connected to the active pattern 100 through the second contact hole C2. Thus, the second connecting portion 340 may be electrically connected to the first gate electrode 205 through the second contact hole C2.

The third connecting portion 350 may be electrically connected to the active pattern 100 through the eighth contact hole C8. Thus, the third connecting portion 350 may be electrically connected to the second electrode of the sixth transistor TR6 and the second electrode of the seventh transistor TR7 through the eighth contact hole C8.

The third insulation layer 50 may be disposed on the second insulating interlayer 40 on which the data pattern is formed. The third insulation layer 50 may have a single-layered structure or a multi-layered structure including at least two insulation films. The third insulation layer 50 may include an organic material. For example, the third insulation layer 50 may include photoresist, acryl-based resin, polyimide-based resin, polyamide-based resin, siloxane-based resin, or the like. These may be used alone or in a combination thereof. Alternatively, the third insulation layer 50 may include an inorganic material. For example, the third insulation layer 50 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, or the like. These may be used alone or in a mixture thereof.

A ninth contact hole C9 may be formed through the third insulation layer 50 and overlap the eighth contact hole C8.

The first electrode PE may be disposed on the third insulation layer 50. The first electrode PE may be electrically connected to the third connecting portion 350 through the ninth contact hole C9.

The first electrode PE may include a reflective material or a transmissive material in accordance with the emission type of the display apparatus. For example, the first electrode PE may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like. These may be used alone or in a combination thereof. In example embodiments, the first electrode PE may have a single layer structure or a multi layer structure, which may include a metal film, an alloy film, a metal nitride film, a conductive metal oxide film and/or a transparent conductive film.

A pixel defining layer 60 may be disposed on the third insulation layer 50 on which the first electrode PE is formed. The pixel defining layer 60 may include an organic material or an inorganic material. For example, the pixel defining layer 60 may be formed using photoresist, acryl-based resin, polyacryl-based resin, polyimide-based resin, a silicon compound, and the like. In example embodiments, the pixel defining layer 60 may be partially etched to form an opening partially exposing the first electrode PE. The opening of the pixel defining layer 60 may define a luminescent region and a non-luminescent region of the display apparatus. For example, a portion of the display apparatus having the opening of the pixel defining layer 60 may be the luminescent region of the display device while another portion of the display apparatus around the opening of the pixel defining layer 60 may be the non-luminescent region of the display device.

The light emitting structure 70 may be positioned on the first electrode PE exposed by the opening of the pixel defining layer 60. The light emitting structure 70 may extend on a sidewall of the opening of the pixel defining layer 60. The light emitting structure 70 may be formed by a laser induced thermal imaging process, a printing process, or the like. The light emitting structure 70 may include an organic light emitting layer (EL), a hole injection layer (HIL), a hole transfer layer (HTL), an electron transfer layer (ETL), an electron injection layer (EIL), and the like. In example embodiments, a plurality of organic light emitting layers may be formed using light emitting materials for generating different colors of light such as for example a red color of light (R), a green color of light (G) and a blue color of light (B) in accordance with color pixels of the display device. In some example embodiments, the organic light emitting layer of the of the light emitting structure 70 may include a plurality of stacked light emitting materials for generating a red color of light, a green color of light and a blue color of light to thereby emitting a white color of light.

The second electrode 80 may be disposed on the light emitting structure 70 and the pixel defining layer 60. The second electrode 80 may include a transmissive material or a reflective material in accordance with the emission type of the display device. For example, the second electrode 80 may include aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like. These may be used alone or in a combination thereof. In example embodiments, the second electrode 80 may also have a single layer structure or a multi layer structure, which may include a metal film, an alloy film, a metal nitride film, a conductive metal oxide film and/or a transparent conductive film.

A protecting layer 90 may be disposed on the second electrode 80. The protecting layer 90 may include a resin, for example, photoresist, acryl-based resin, polyimide-based resin, polyamide-based resin, siloxane-based resin, or the like. These may be used or in a combination thereof.

According to some embodiments, the active pattern 100 may include a first capacitor area 101 and a second capacitor area 102 disposed between the second transistor TR2 and the fifth transistor TR5. The first capacitor area 101 may overlap the data line 310. The second capacitor area 102 may overlap the driving voltage line 320.

Thus, the first capacitor area 101, the first and second insulation layers 30 and 40 and the data line 310 may form a first capacitor CC1. The first capacitor CC1 may prevent degradation of display quality due to fluctuation of the data signal DATA.

In addition, the second capacitor area 102, the first and second insulation layers 30 and 40 and the driving voltage line 320 may form a second capacitor CC2. The second capacitor area 102 may reduce amount of fluctuation of voltage level of the first electrode of the first transistor TR1 due to fluctuation of voltage level of adjacent electrodes. Thus, display quality may be improved.

Figure 5:
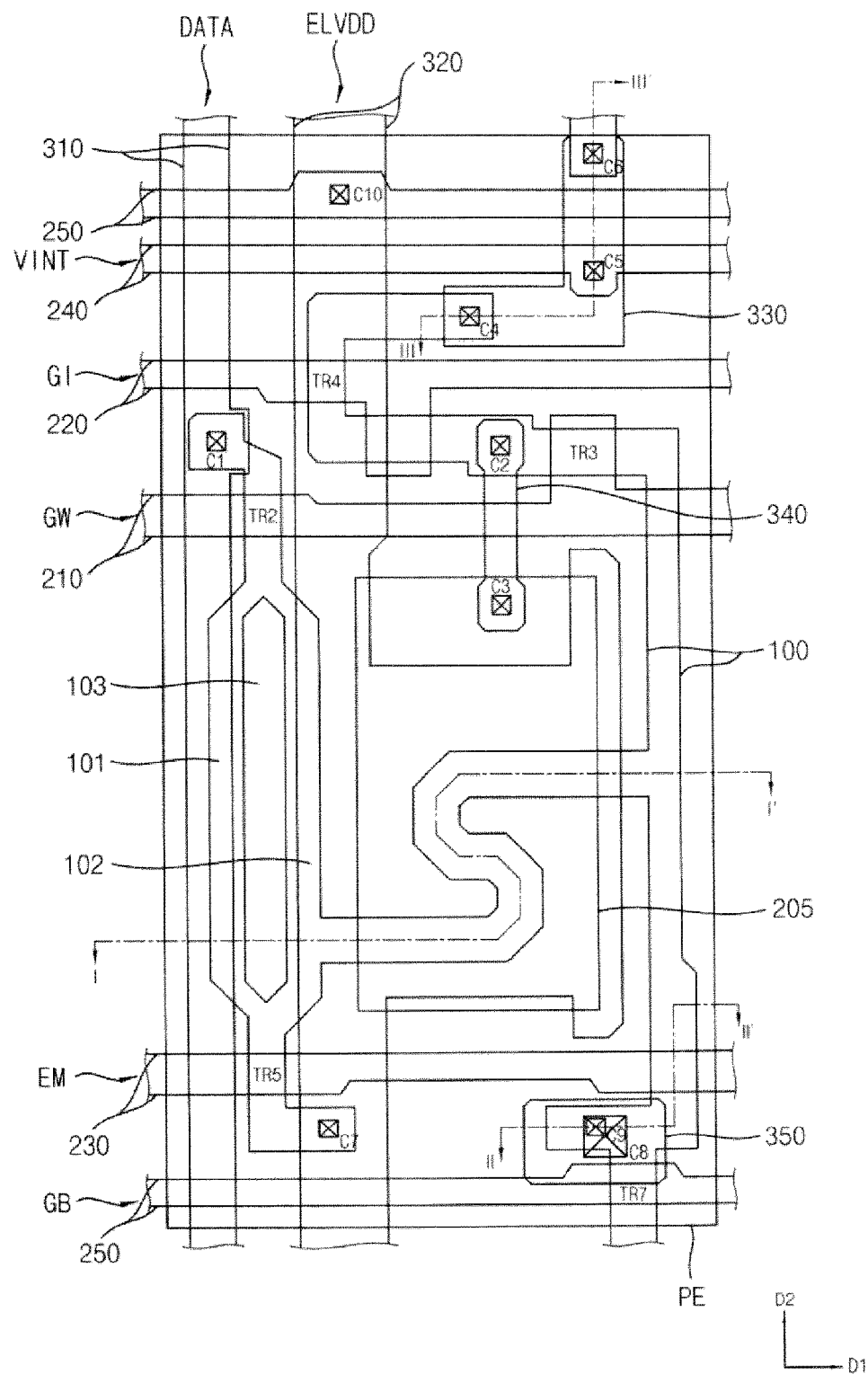
FIG. 5 is a plan view illustrating a pixel of an organic light emitting display apparatus according to an example embodiment.

FIG. 5 is a plan view illustrating a pixel of an organic light emitting display apparatus according to an example embodiment.

Referring to FIG. 5, the organic light emitting display apparatus may be substantially same as the organic light emitting display apparatus of FIG. 3, except that the active pattern includes a first capacitor area and a second capacitor area, and an opening 103 is formed between the first capacitor area and the second capacitor area.

FIGS. 6, 7A-7C, 8, 9A-9C, 10, 11A-11C, 12, 13A-13C, 14 and 15A-15C are plan views and cross-sectional views illustrating a method of manufacturing the organic light emitting display apparatus of FIG. 3.

Figure 6:
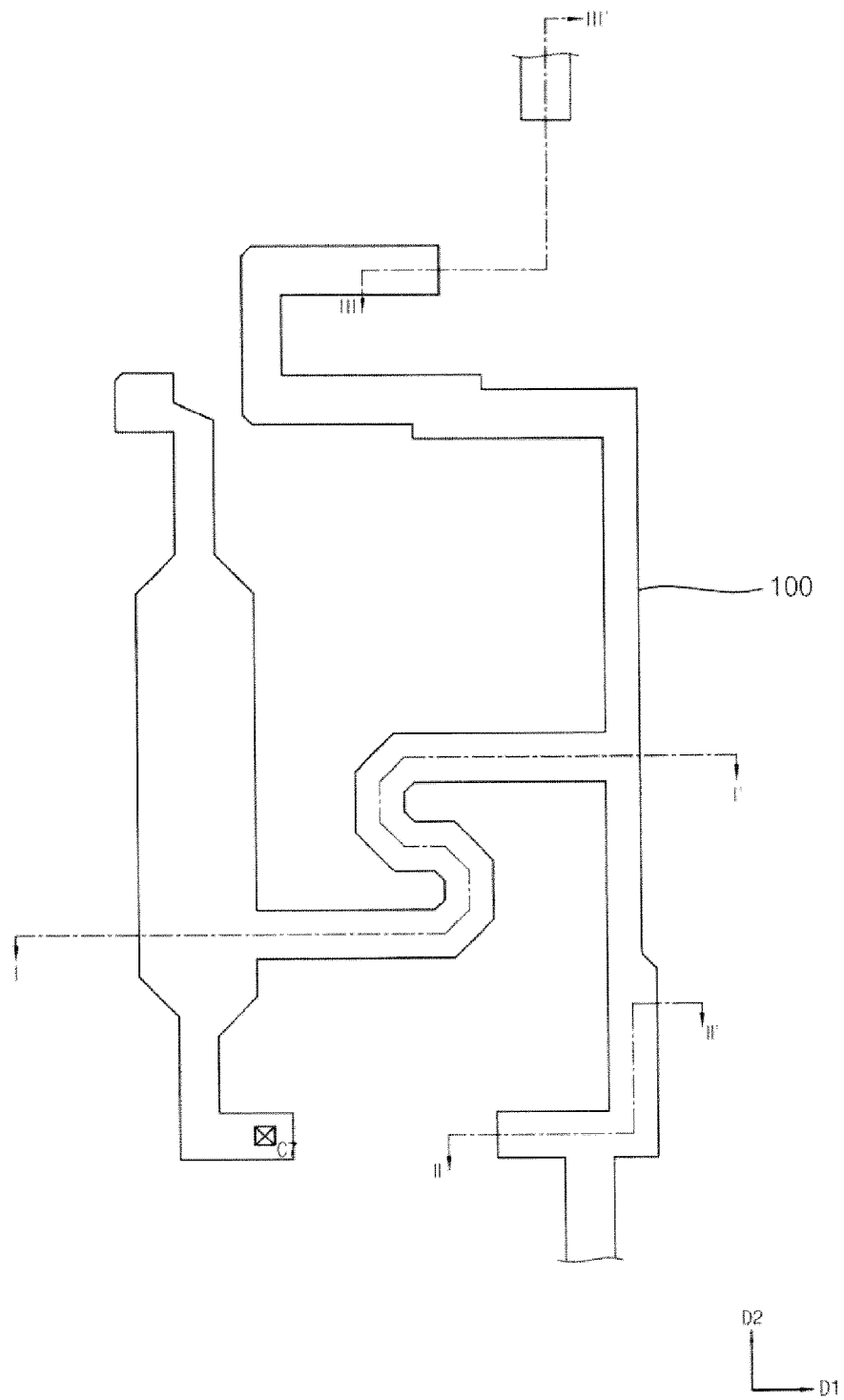
FIGS. 6, 7A-7C, 8, 9A-9C, 10, 11A-11C, 12, 13A-13C, 14 and 15A-15C are plan views and cross-sectional views illustrating a method of manufacturing the organic light emitting display apparatus of FIG. 3.
Figure 7A:
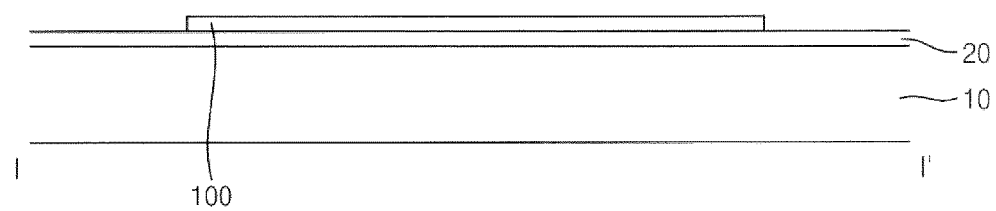
Figure 7B:
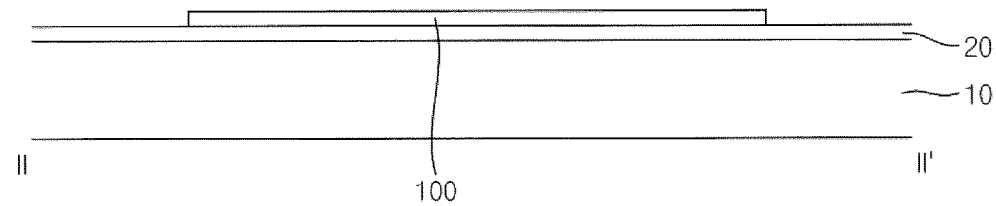
Figure 7C:
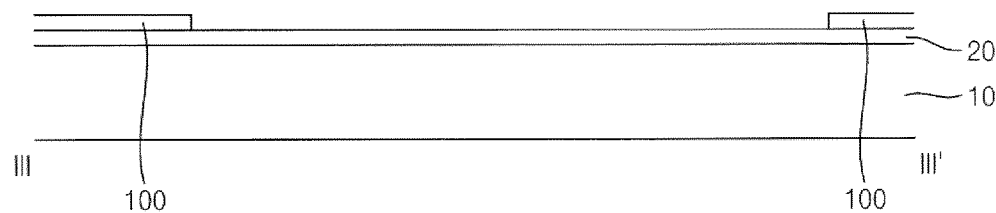

FIG. 6 is a plan view illustrating the method. FIG. 7A is a cross-sectional view taken along a line I-I' of FIG. 6. FIG. 7B is a cross-sectional view taken along a line II-II' of FIG. 6. FIG. 7C is a cross-sectional view taken along a line III-III' of FIG. 6.

Referring to FIGS. 6 and 7A to 7C, a buffer layer 20 may be formed on a base substrate 10.

The base substrate 10 may include a transparent insulation substrate. For example, the base substrate 10 may include a glass substrate, a quartz substrate, a transparent resin substrate, or the like. Examples of the transparent resin substrate for the base substrate 10 include polyimide-based resin, acryl-based resin, polyacrylate-based resin, polycarbonate-based resin, polyether-based resin, sulfonic acid containing resin, polyethyleneterephthalate-based resin, and the like.

The buffer layer 20 may be disposed on the base substrate 10. The buffer layer 20 may be obtained on the base substrate 10 by a spin coating process, a chemical vapor deposition (CVD) process, a plasma enhanced chemical vapor deposition (PECVD) process, a high density plasma-chemical vapor deposition (HDP-CVD) process, a printing process, or the like.

An active pattern 100 may be formed on the buffer layer 20.

In example embodiments, a semiconductor layer (not illustrated) may be formed on the buffer layer 20, and then a preliminary active layer (not illustrated) may be formed on the buffer layer 20 by patterning the semiconductor layer. The crystallization process may be performed about the preliminary active layer to form the active pattern 100 on the buffer layer 20. The semiconductor layer may be formed by a CVD process, a PECVD process, a low pressure chemical vapor deposition (LPCVD) process, a sputtering process, a printing process, or the like. When the semiconductor layer includes amorphous silicon, the active pattern 100 may include polysilicon. The crystallization process for forming the active pattern 100 may include a laser irradiation process, a thermal treatment process, a thermal process utilizing a catalyst, or the like. In some example embodiments, a dehydrogenation process may be performed about the semiconductor layer and/or the preliminary active layer after forming the semiconductor layer and/or the preliminary active layer on the buffer layer 20. The dehydrogenation process may reduce the hydrogen concentration of the semiconductor layer and/or the preliminary active layer, so that the active pattern 100 may have improved electrical characteristics.

The active pattern may include first to fourteenth regions a, b, c, d, e, f, g, h, i, j, k, l, m and n (not shown in FIGS. 7A-7C). The first to fourteenth regions a, b, c, d, e, f, g, h, i, j, k, l, m and n may be doped by an impurity such that the first to fourteenth regions a, b, c, d, e, f, g, h, i, j, k, l, m and n have a higher electrical conductivity than other region of the active pattern 100. The first to fourteenth regions a, b, c, d, e, f, g, h, i, j, k, l, m and n may be used to form source or drain electrodes of first to seventh transistors TR1, TR2, TR3, TR4, TR5, TR6 and TR7. Boundaries of the first to fourteenth regions a, b, c, d, e, f, g, h, i, j, k, l, m and n may not be clearly divided and may be electrically connected to each other. For example, as illustrated in FIG. 8, the second region b may not be clearly divided from the fifth region e and eleventh region k, and the regions may be electrically connected to each other.

Figure 8:
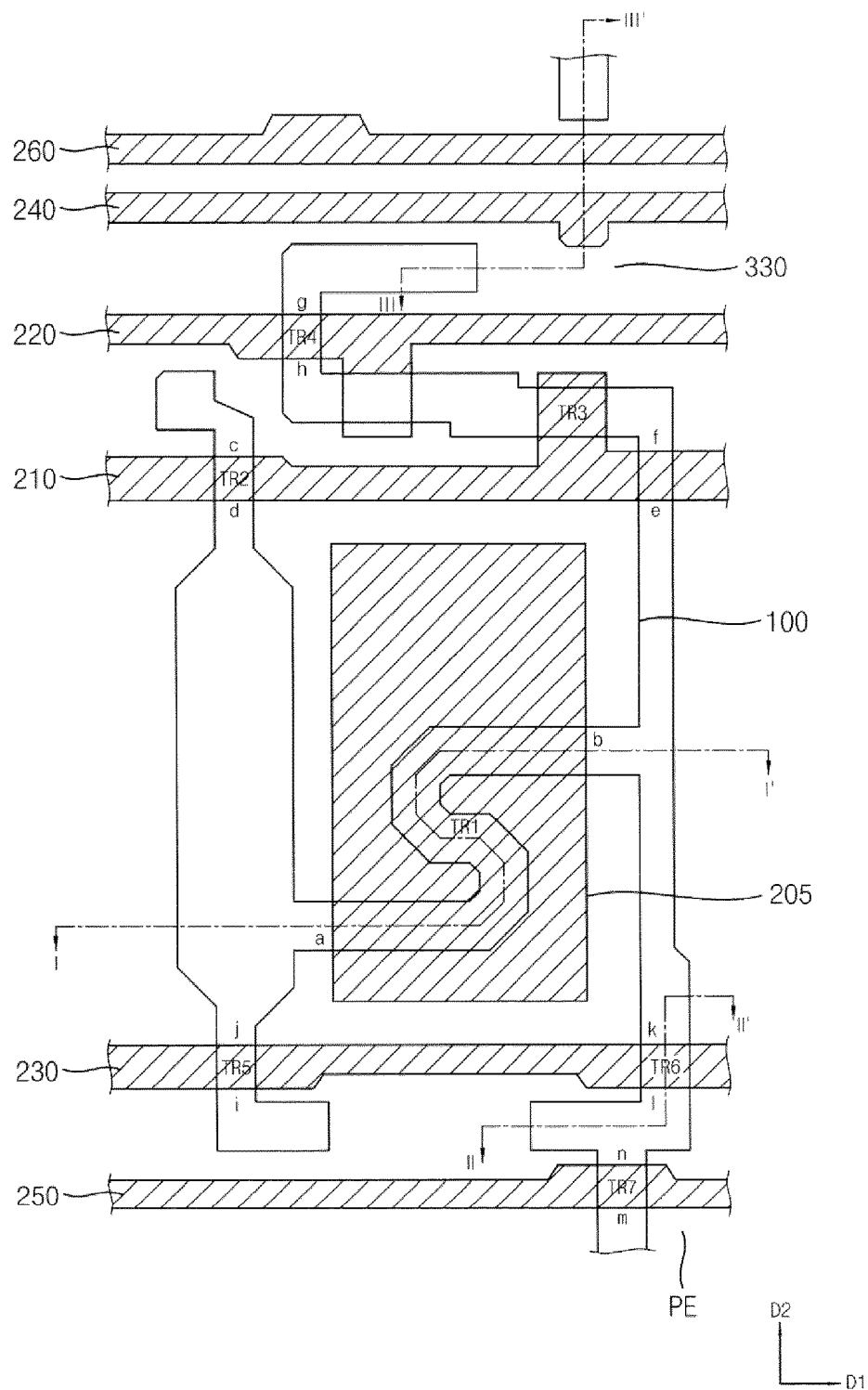
Figure 9A:
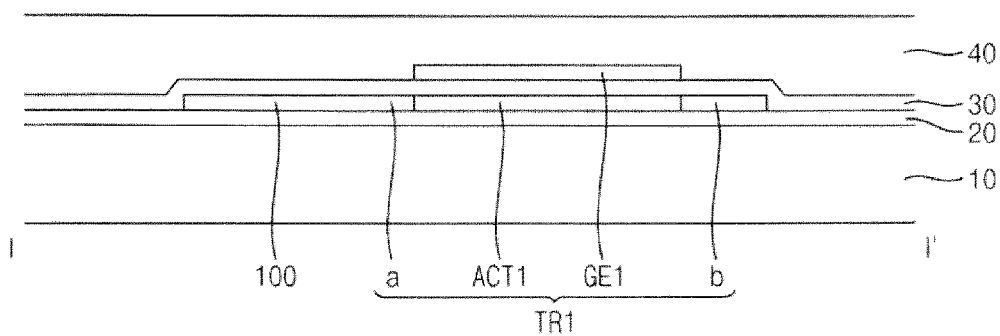
Figure 9B:
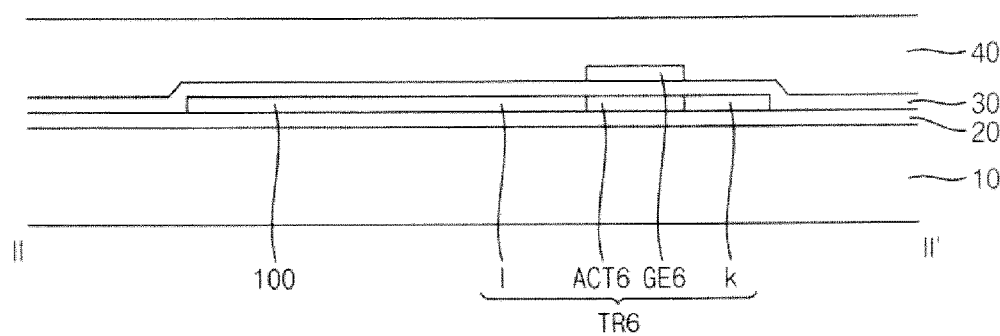
Figure 9C:
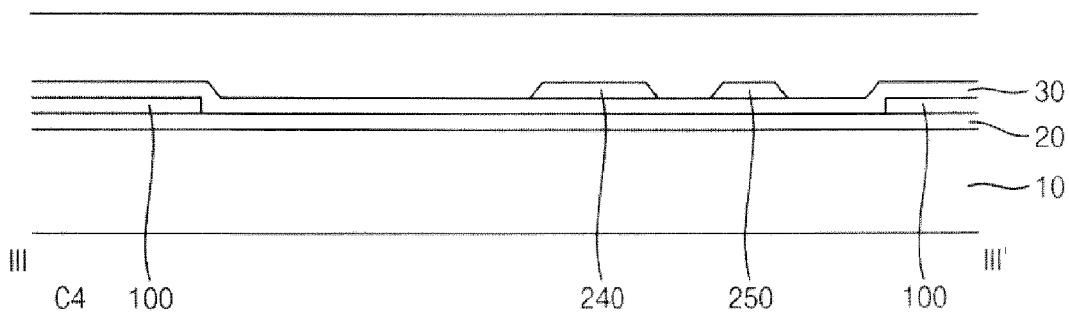

FIG. 8 is a plan view illustrating the method. FIG. 9A is a cross-sectional view taken along a line I-I' of FIG. 8. FIG. 9B is a cross-sectional view taken along a line II-II' of FIG. 8. FIG. 9C is a cross-sectional view taken along a line III-III' of FIG. 8.

Referring to FIGS. 8 and 9A to 9C, a first insulation layer 30 may be formed on the buffer layer 20 on which the active pattern 100 is formed.

The first insulation layer 30 may be formed by a CVD process, a spin coating process, a PECVD process, a sputtering process, a vacuum evaporation process, an HDP-CVD process, a printing process, or the like.

A gate pattern may be formed on the first insulation layer 30. In example embodiments, a first conductive layer (not illustrated) may be formed on the first insulation layer 30, and then the first conductive layer may be partially etched by a photolithography process or an etching process using an additional etching mask. Hence, the gate pattern may be provided on the first insulation layer 30. The first conductive layer may be formed by a printing process, a sputtering process, a CVD process, a pulsed laser deposition (PLD) process, a vacuum evaporation process, an atomic layer deposition (ALD) process, or the like.

The gate pattern may include a first gate electrode 205, a scan line 210, a data initialization line 220, an emission control line 230, an initialization voltage line 240, a bypass control line 250 and an auxiliary driving voltage line 260.

A second insulation layer 40 may be formed on the first insulation layer 30 on which the gate pattern is formed.

The second insulation layer 40 may be formed by a CVD process, a spin coating process, a PECVD process, a sputtering process, a vacuum evaporation process, an HDP-CVD process, a printing process, or the like.

Figure 10:
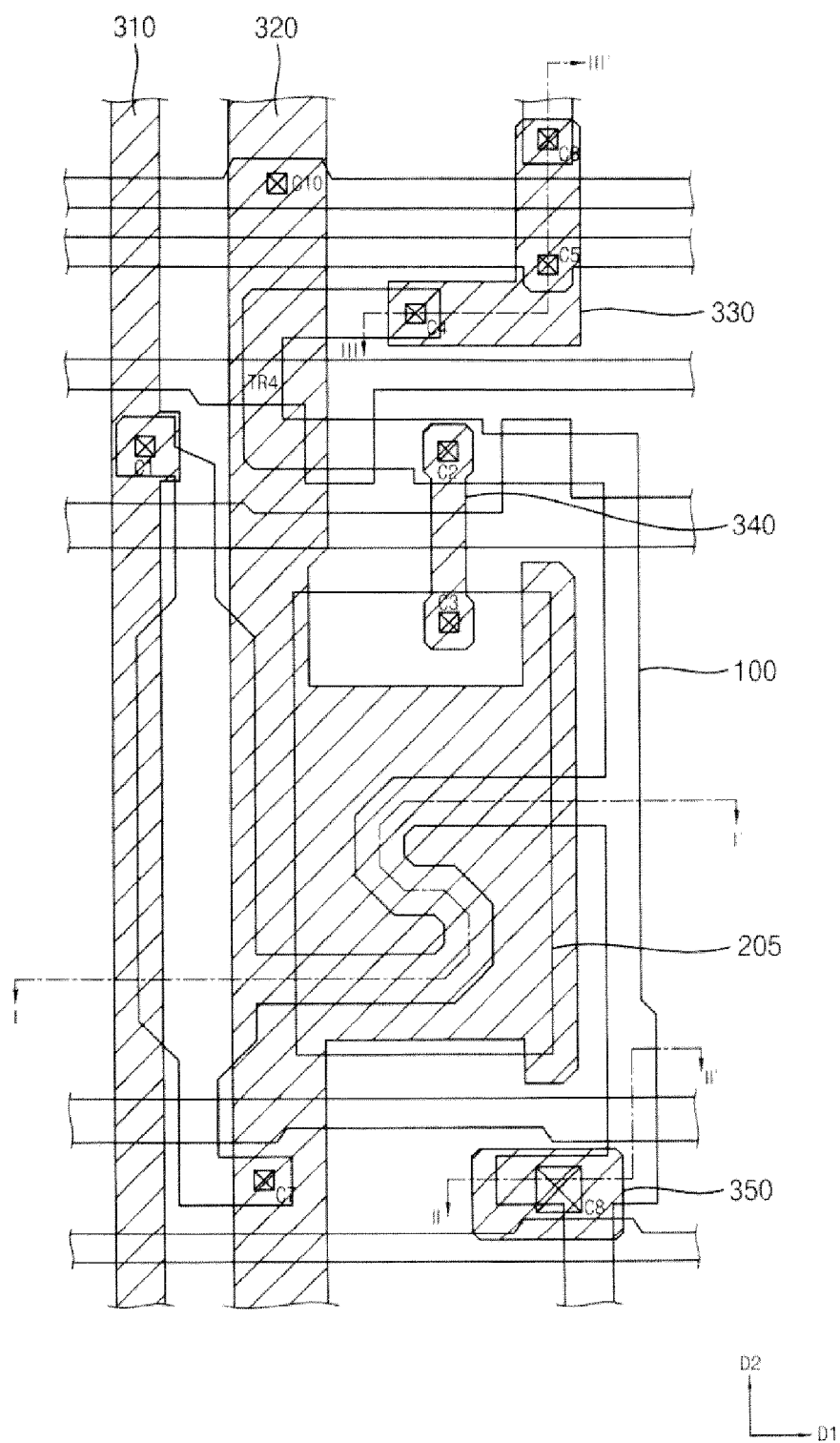
Figure 11A:
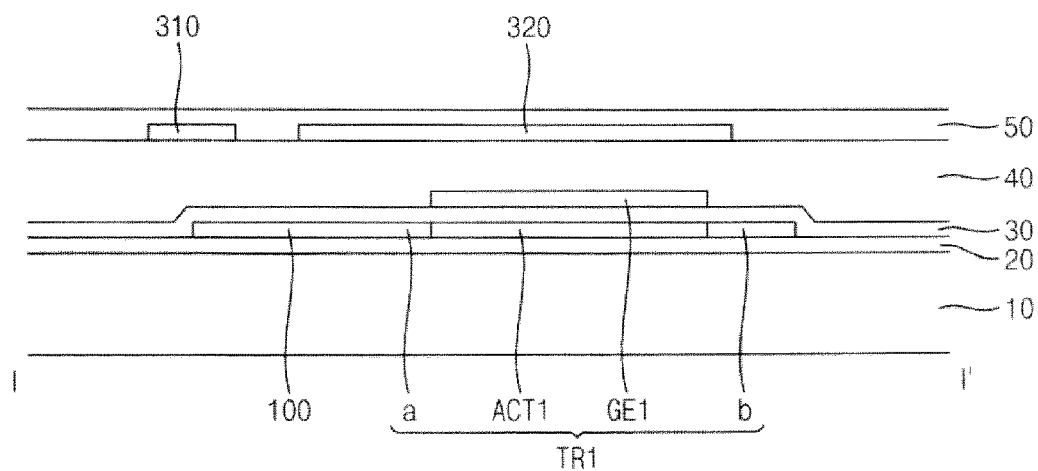
Figure 11B:
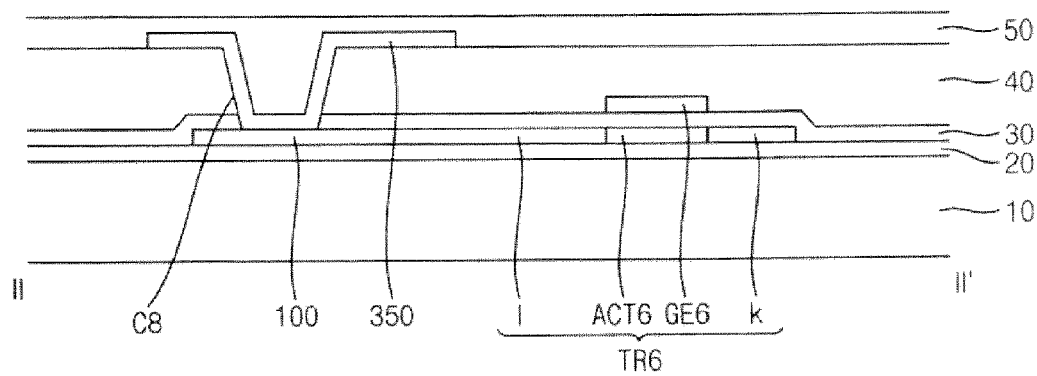
Figure 11C:
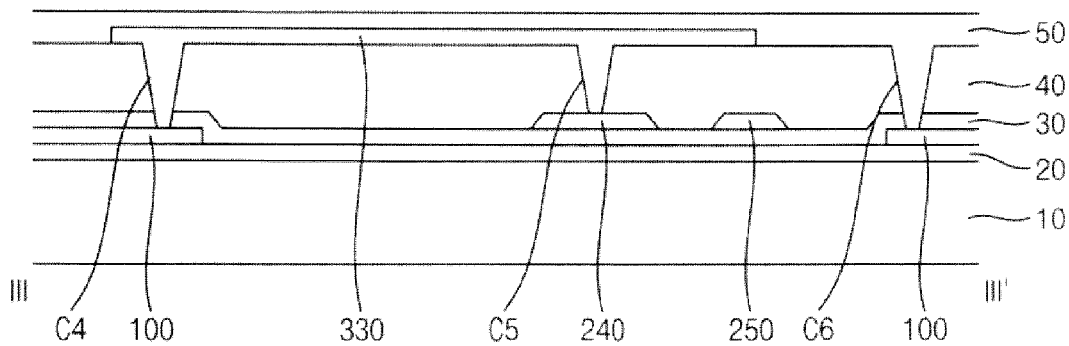

FIG. 10 is a plan view illustrating the method. FIG. 11A is a cross-sectional view taken along a line I-I' of FIG. 10. FIG. 11B is a cross-sectional view taken along a line II-II' of FIG. 10. FIG. 11C is a cross-sectional view taken along a line III-III' of FIG. 10.

Referring to FIGS. 10 and 11A to 11C, a data pattern may be formed on the second insulation layer 40.

First to eighth and tenth contact holes C1 to C8 and C10 which expose the active pattern 100 may be formed by partially etching the second insulation layer 40 and the first insulation layer 30. And then, a second conductive layer may be formed on the second insulation layer 40 to fill the contact holes. After that, a data pattern may be obtained by patterning the second conductive layer. The second conductive layer may be formed by a printing process, a sputtering process, a CVD process, a pulsed laser deposition (PLD) process, a vacuum evaporation process, an atomic layer deposition (ALD) process, or the like.

The data pattern may include a data line 310, a driving voltage line 320, a first connecting portion 330, a second connecting portion 340 and a third connecting portion 350.

A third insulation layer 50 may be formed on the second insulation layer 40 on which the data pattern is formed.

In example embodiments, a planarization process may be executed on the third insulation layer 50 to enhance the flatness of the third insulation layer 50. For example, the third insulation layer 50 may have a substantially level surface by a chemical mechanical polishing (CMP) process, an etch-back process, or the like. The third insulation layer 50 may include an organic material.

The third insulation layer 50 may be obtained by a spin coating process, a printing process, a sputtering process, a CVD process, an ALD process, a PECVD process, an HDP-CVD process or a vacuum evaporation process in accordance with ingredients included in the third insulation layer 50.

Figure 12:
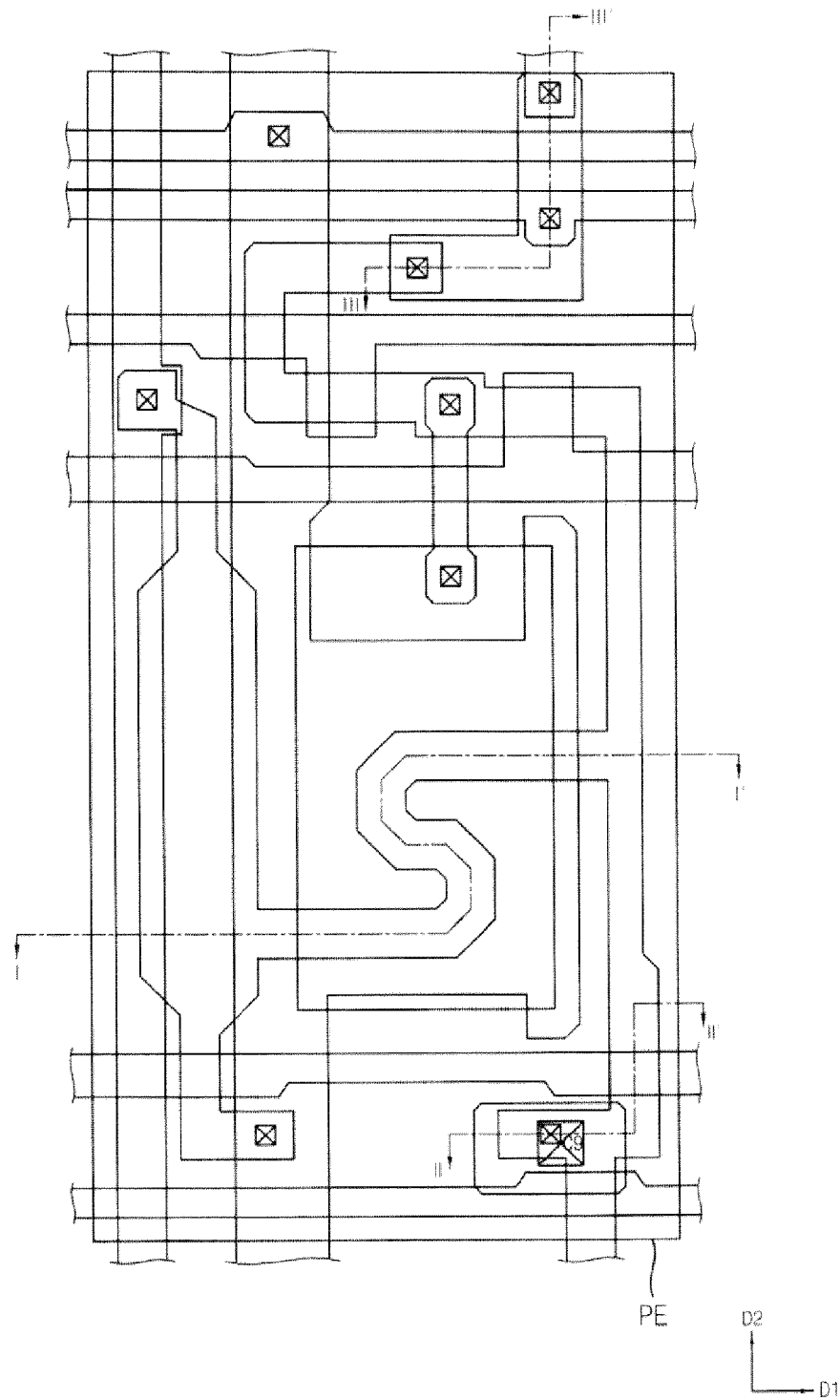
Figure 13A:
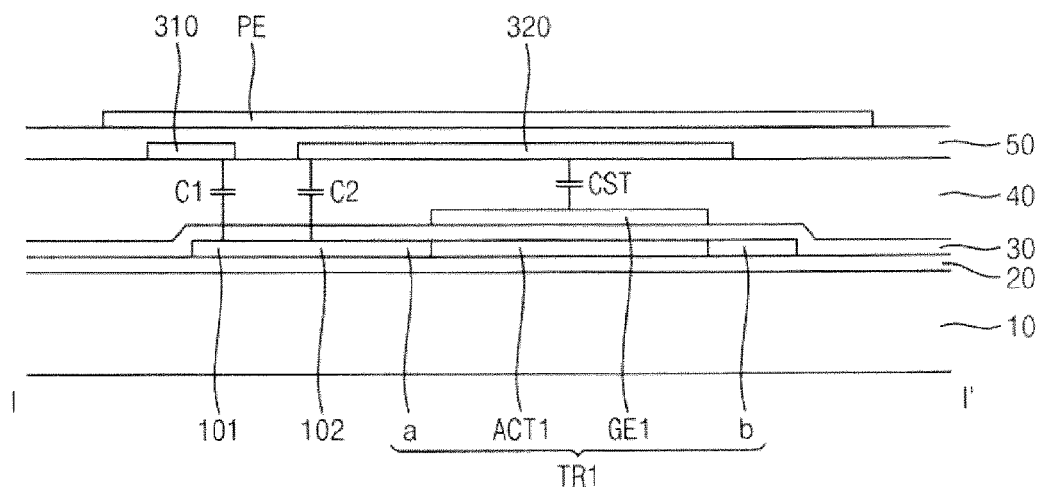
Figure 13B:
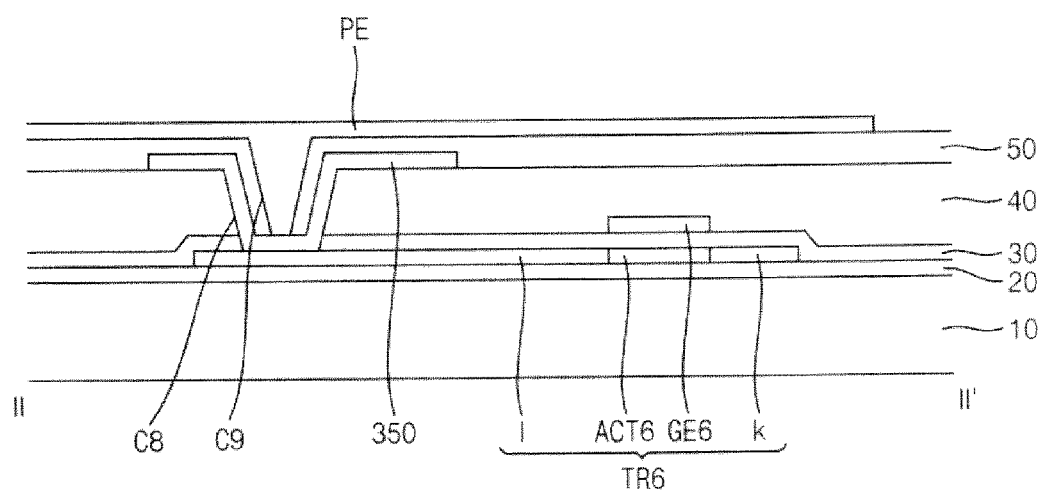
Figure 13C:
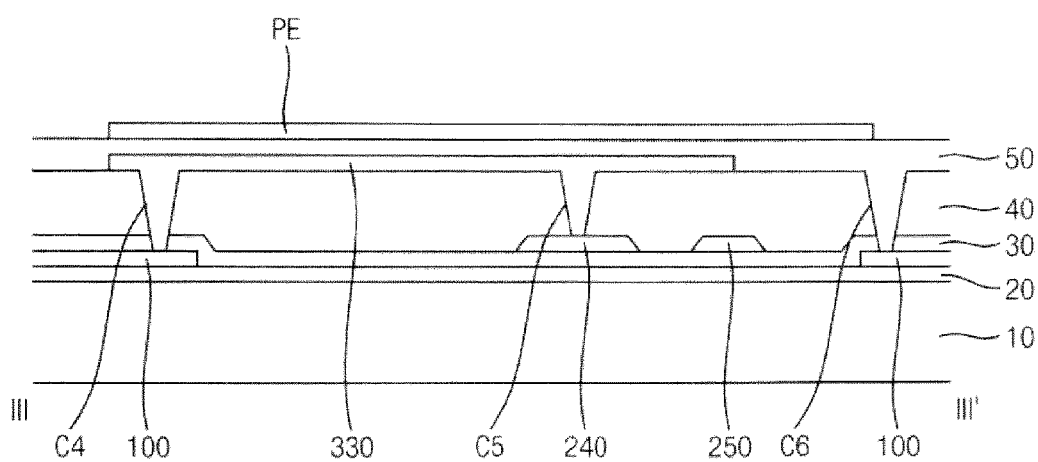

FIG. 12 is a plan view illustrating the method. FIG. 13A is a cross-sectional view taken along a line I-I' of FIG. 12. FIG. 13B is a cross-sectional view taken along a line II-II' of FIG. 12. FIG. 13C is a cross-sectional view taken along a line III-III' of FIG. 12.

Referring to FIGS. 12 and 13A to 13C, a first electrode PE may be formed on the third insulation layer 50.

A ninth contact hole C9 which exposes the data pattern may be formed by partially patterning the third insulation layer 50, and then a third conductive layer may be formed on the third insulation layer 50 to fill the ninth contact hole C9. After that, the first electrode PE may be obtained by patterning the second conductive layer. The third conductive layer may be formed by a printing process, a sputtering process, a CVD process, a pulsed laser deposition (PLD) process, a vacuum evaporation process, an atomic layer deposition (ALD) process, or the like.

Figure 14:
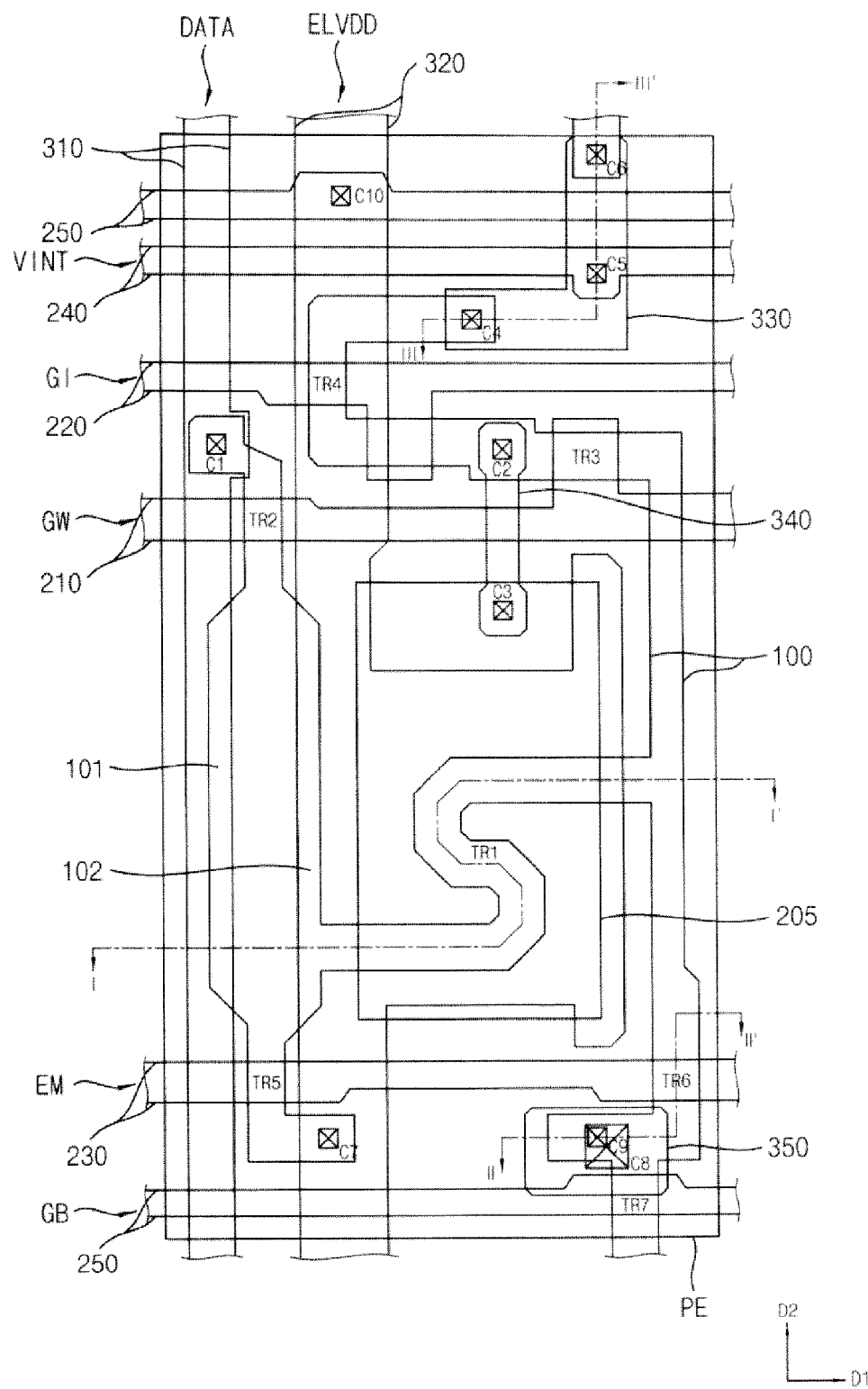
Figure 15A:
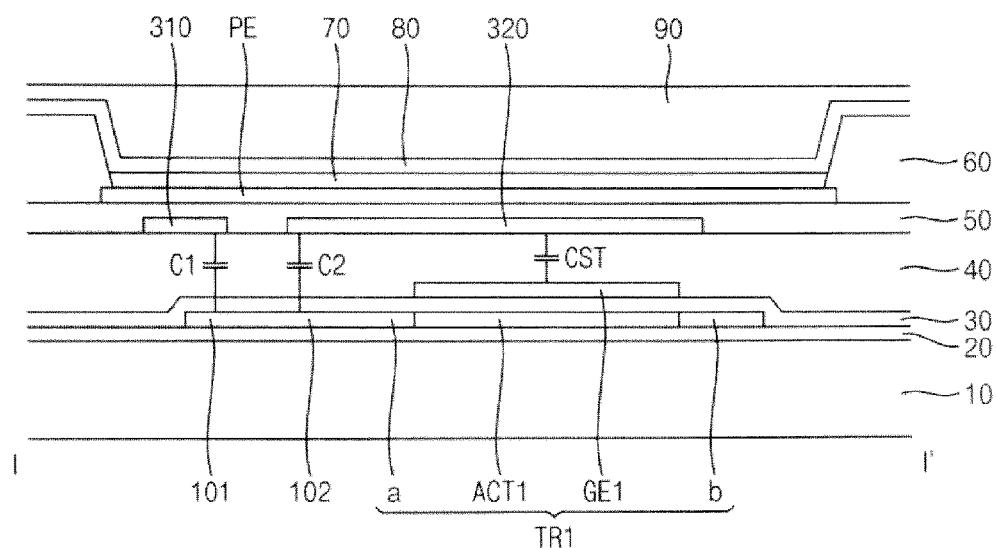
Figure 15B:
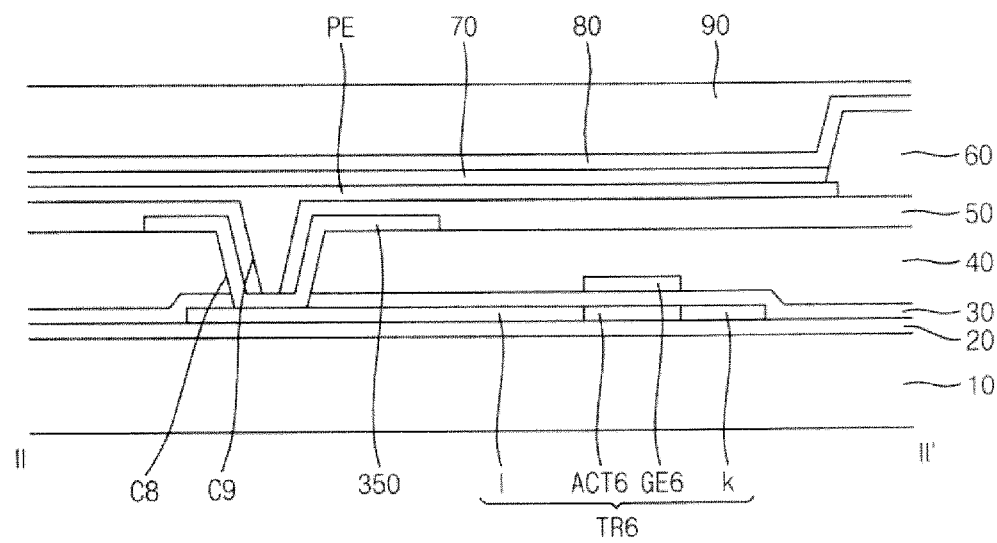
Figure 15C:
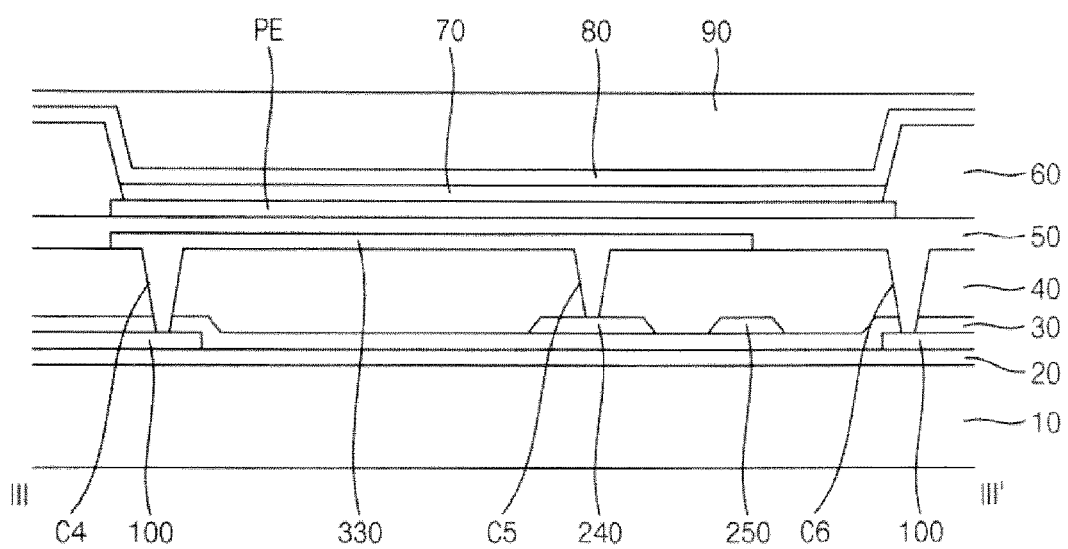

FIG. 14 is a plan view illustrating the method. FIG. 15A is a cross-sectional view taken along a line I-I' of FIG. 14. FIG. 15B is a cross-sectional view taken along a line II-II' of FIG. 14. FIG. 15C is a cross-sectional view taken along a line III-III' of FIG. 14.

Referring to FIGS. 14 and 15A to 15C, a pixel defining layer 60 may be formed on the first electrode PE.

The pixel defining layer 60 may be obtained by a spin coating process, a spray process, a printing process, a CVD process, a PECVD process, an HDP-CVD process, or the like. In example embodiments, the pixel defining layer 60 may be partially etched to form an opening partially exposing the first electrode PE. The opening of the pixel defining layer 60 may define a luminescent region and a non-luminescent region of the display apparatus. For example, a portion of the display apparatus having the opening of the pixel defining layer 60 may be the luminescent region of the display device while another portion of the display apparatus around the opening of the pixel defining layer 60 may be the non-luminescent region of the display device.

The light emitting structure 70 may be formed on the first electrode PE exposed by the opening of the pixel defining layer 60. The light emitting structure 70 may be formed by a laser induced thermal imaging process, a printing process, or the like.

The second electrode 80 may be formed on the light emitting structure 70 and the pixel defining layer 60. The second electrode 80 may be formed by a printing process, a sputtering process, a CVD process, an ALD process, a vacuum evaporation process, a PLD process, or the like.

The protecting layer 90 may be displayed on the second electrode 80. The protecting layer 90 may include a resin, for example, photoresist, acryl-based resin, polyimide-based resin, polyamide-based resin, siloxane-based resin, or the like. These may be used or in a combination thereof.

Embodiments may be applied to an organic light emitting display device, and an electronic device having the organic light emitting display device. For example, embodiments may be applied to a computer monitor, a television, a laptop, a digital camera, a cellular phone, a smart-phone, a smart-pad, a personal digital assistants (PDA), a portable multi-media player (PMP), an MP3 player, a navigation system, a video-phone, and the like.

The foregoing is illustrative of example embodiments and is not to be construed as limiting thereof. Although a few exemplary embodiments have been described, those skilled in the art will readily appreciate that many modifications are possible without materially departing from the novel teachings and advantages. Accordingly, all such modifications are intended to be included within the scope of as defined in the claims. In the claims, means-plus-function clauses are intended to cover the structures described herein as performing the recited function and not only structural equivalents but also equivalent structures. Therefore, it is to be understood that the foregoing is illustrative and is not to be construed as limited to the specific embodiments disclosed, and that modifications to the disclosed embodiments, as well as other embodiments, are intended to be included within the scope of the appended claims. The inventive concepts are defined by the following claims, with equivalents of the claims to be included therein.

What is claimed is:

1. An organic light emitting display apparatus comprising:
a base substrate;
an active pattern disposed on the base substrate, the active pattern comprising:
   a first transistor comprising a source area, a drain area and a channel,
   a first capacitor area, and
   a second capacitor area;
a data line disposed on the base substrate, and extending in a second direction substantially perpendicular to a first direction, the data line overlapped with the first capacitor area;
a second insulation layer disposed between the first capacitor area and the data line, and between the second capacitor area and the driving voltage line; and
a driving voltage line disposed on the base substrate, and extending in the second direction substantially perpendicular to the first direction, the driving voltage line overlapped with the second capacitor area.

2. The organic light emitting display apparatus of claim 1, further comprising a first insulation layer disposed between the first capacitor area and the data line, and between the second capacitor area and the driving voltage line.

3. The organic light emitting display apparatus of claim 1, further comprising a first gate electrode overlapping the channel of the first transistor, and
wherein a first insulation layer is disposed between the gate electrode and the channel of the first transistor.

4. The organic light emitting display apparatus of claim 1, wherein a portion of the driving voltage line is configured to overlap the first gate electrode, and
the second insulation layer is disposed between the portion of the driving voltage line.

5. The organic light emitting display apparatus of claim 1, wherein the driving voltage line and the data line include a same conductive layer.

6. The organic light emitting display apparatus of claim 5, further comprising:
a first gate electrode overlapping the channel of the first transistor;
a scan line disposed on the base substrate and extending in the first direction,
a data initialization line disposed on the base substrate and substantially parallel with the scan line;
an initialization voltage line disposed on the base substrate and substantially parallel with the scan line;
an emission control line disposed on the base substrate and substantially parallel with the scan line; and
a bypass control line disposed on the base substrate and substantially parallel with the scan line.

7. The organic light emitting display apparatus of claim 6, further comprising an auxiliary driving voltage line disposed on the base substrate and substantially parallel with the scan line,
wherein the auxiliary driving voltage line is electrically connected to the driving voltage line.

8. The organic light emitting display apparatus of claim 7, wherein the first gate electrode, the scan line, the data initialization line, the initialization voltage line, the emission control line, the bypass control line and the auxiliary driving voltage line are formed on a same layer.

9. The organic light emitting display apparatus of claim 6, further comprising:
a first connecting portion electrically connecting the initialization voltage line to the active pattern;
a second connecting portion electrically connecting the first gate electrode to the active pattern; and
a third connecting portion electrically connecting the active pattern to a first electrode for driving an organic light emitting diode.

10. The organic light emitting display apparatus of claim 1, wherein the first capacitor area and the second capacitor area are electrically connected to the source area of the first transistor.

11. The organic light emitting display apparatus of claim 10, wherein the active pattern further comprises a second source area, a second drain area and a second channel of a second transistor,
the active pattern further comprises a third source area, a third drain area and a third channel of a third transistor,
the active pattern further comprises a fourth source area, a fourth drain area and a fourth channel of a fourth transistor,
the active pattern further comprises a fifth source area, a fifth drain area and a fifth channel of a fifth transistor, and
wherein the first capacitor area and the second capacitor area of the active pattern are electrically connected to the second transistor and the fifth transistor.

12. The organic light emitting display apparatus of claim 11, wherein the first capacitor area and the second capacitor area are directly connected to the first source area, the second drain area and the fifth drain area.

13. The organic light emitting display apparatus of claim 10, wherein the active pattern further comprises a sixth source area, a sixth drain area and a sixth channel of a sixth transistor, and
wherein the active pattern further comprises a seventh source area, a seventh drain area and a seventh channel of a seventh transistor.

14. The organic light emitting display apparatus of claim 1, further comprising a data driving part configured to alternately output a first data signal and a second data signal to pixels different from each other in one horizontal period.

15. An organic light emitting display apparatus, comprising a plurality of pixels, each of the pixels comprising:
an organic light emitting diode;
a first transistor configured to operate the organic light emitting diode by generating a driving voltage, the first transistor comprising a first data signal electrode, a first connection electrode and a first gate electrode;
a second transistor comprising:
a second data signal electrode to which a data signal is applied,
a second connection electrode which is electrically connected to the first data signal electrode, and
a gate electrode to which a scan signal is applied;
a storage capacitor formed between a first power voltage and the first gate electrode;
a first capacitor formed between the data signal and the first data signal electrode; and
a second capacitor formed between the first power voltage and the first data signal electrode.

16. The organic light emitting display apparatus of claim 15, further comprising a data driving part configured to alternately output a first data signal and a second data signal to pixels different from each other in one horizontal period.

17. The organic light emitting display apparatus of claim 16, further comprising:
a third transistor comprising a third gate electrode to which the scan signal is applied, a third gate signal electrode which is electrically connected to the first connection electrode, and a third connection electrode which is electrically connected to the first gate electrode; and
a fourth transistor comprising a fourth gate electrode to which a data initialization signal is applied, a fourth data signal electrode to which an initialization voltage is applied, and a fourth connection electrode which is electrically connected to the first gate electrode.

18. The organic light emitting display apparatus of claim 16, further comprising:
a fifth transistor comprising a fifth gate electrode to which an emission signal is applied, a fifth data signal electrode to which the first power voltage is applied, a fifth connection electrode which is electrically connected to the first data signal electrode;
a sixth transistor comprising a sixth gate electrode to which the emission signal is applied, a sixth data signal electrode which is electrically connected to the first connection electrode, and a sixth connection electrode which is electrically connected to a first electrode of the organic light emitting diode; and a seventh transistor comprising a seventh gate electrode to which a diode initialization signal is applied, a seventh data signal electrode to which the initialization voltage is applied, and a seventh connection electrode which is electrically connected to the first electrode of the organic light emitting diode.

19. The organic light emitting display apparatus of claim 15, wherein the first capacitor and the second capacitor are formed by a parasitic capacitance.

* * * * *